US011533020B2

(12) United States Patent
Rode et al.

(10) Patent No.: US 11,533,020 B2
(45) Date of Patent: Dec. 20, 2022

(54) SINGLE MAGNETIC-LAYER MICROWAVE OSCILLATOR

(71) Applicant: The Provost, Fellows, Foundation Scholars, and the Other Members of Board, of the College of the Holy and Undivided Trinity of Queen Elizabeth, near Dublin, Dublin (IE)

(72) Inventors: Karsten Rode, Dublin (IE); Plamen Stamenov, Dublin (IE); John Michael David Coey, Dublin (IE); Yong Chang Lau, Tokyo (JP); Davide Betto, Triuggio (IT); Arne Brataas, Trondheim (NO); Roberto Troncoso, Trondheim (NO)

(73) Assignee: THE PROVOST, FELLOWS, FOUNDATION SCHOLARS, AND THE OTHER MEMBERS OF BOARD, OF THE COLLEGE OF THE HOLY AND UNDIVIDED TRINITY OF QUEEN ELIZABETH, NEAR DUBLIN, Dublin (IE)

( * ) Notice: Subject to any disclaimer, the term of this patent is extended or adjusted under 35 U.S.C. 154(b) by 131 days.

(21) Appl. No.: 17/049,309

(22) PCT Filed: Apr. 23, 2019

(86) PCT No.: PCT/EP2019/060394
§ 371 (c)(1),
(2) Date: Oct. 20, 2020

(87) PCT Pub. No.: WO2019/202169
PCT Pub. Date: Oct. 24, 2019

(65) Prior Publication Data
US 2021/0044254 A1  Feb. 11, 2021

(30) Foreign Application Priority Data
Apr. 20, 2018 (GB) .................................. 1806425

(51) Int. Cl.
*H03B 15/00* (2006.01)
*H01L 43/08* (2006.01)
(Continued)

(52) U.S. Cl.
CPC .......... *H03B 15/006* (2013.01); *H01L 43/00* (2013.01); *H01L 43/08* (2013.01); *H01L 43/12* (2013.01); *H05B 6/686* (2013.01)

(58) Field of Classification Search
USPC ...................... 331/154, 157; 438/3; 257/421
See application file for complete search history.

(56) References Cited

U.S. PATENT DOCUMENTS 10,008,248 B2 * 6/2018 Buhrman ............ G11C 11/1673
2012/0068779 A1 * 3/2012 Lee ........................ H01L 43/12
257/E43.006
2014/0145792 A1 5/2014 Wang et al.

FOREIGN PATENT DOCUMENTS

EP         2575136 A1    4/2013
WO      2016011435 A1    1/2016
WO      2019202169 A1   10/2019

OTHER PUBLICATIONS

International Search Report and Written Opinion issued in PCT Application Serial No. PCT/EP2019/060394 dated Aug. 30, 2019; 14 pages.

(Continued)

*Primary Examiner* — Arnold M Kinkead
(74) *Attorney, Agent, or Firm* — Brian J. Colandreo; Jeffrey T. Placker; Holland & Knight LLP

(57) ABSTRACT

A method and system for generating voltage and/or current oscillations in a single magnetic layer is provided. The method comprises applying a direct voltage/current to the layer in a longitudinal direction; and developing a longitudinal voltage between a pair of longitudinal voltage leads and/or a transverse voltage between a pair of transverse (Continued)

400 voltage leads. The magnetic layer comprises a ferrimagnetic or antiferrimagnetic material having a first and second magnetic sub-lattice, wherein the first sub-lattice is a dominant sub-lattice such that the charge carriers at the Fermi energy originate predominantly from the dominant sub-lattice and the charge carriers at the Fermi energy are spin polarised. In some embodiments, the dominant current carrying sub-lattice may lack inversion symmetry.

20 Claims, 9 Drawing Sheets

(51) Int. Cl.
    *H01L 43/12*     (2006.01)
    *H01L 43/00*     (2006.01)
    *H05B 6/68*     (2006.01)

(56) References Cited

OTHER PUBLICATIONS

Patents Act 1977: Search Report under Section 17(5) issued in Great Britain Patent Application Serial No. 1806425.3 dated Oct. 22, 2018; 3 pages.

Awari, N. et al., "Narrow-band tunable terahertz emission from ferrimagnetic Mn3-xGA thin films", Applied Physics Letters, vol. 109, (2016), 6 pages.

Azevedo, A. et al., "Electrical detection of ferromagnetic resonance in single layers of permalloy: Evidence of magnonic charge pumping", American Physical Society, Physical Review B, vol. 92, (2015), 7 pages.

Ciccarelli, C. et al., "Magnonic Charge Pumping via Spin-Orbit Coupling", Manuscript, Department of Physics, Norwegian University of Science and Technology, NO-7491, Trondheim, Norway, (Submitted on Nov. 11, 2014), 14 pages.

Kim, Kab-Jin et al., "Fast domain wall motion in the vicinity of the angular momentum compensation temperature of ferrimagnets", Nature Materials, vol. 16, No. 12, Dec. 1, 2017, pp. 1187-1192.

Lauer, V. et al., "Temporal Evolution of Auto-Oscillations in an Yttrium-Iron-Garnet/Platinum Microdisk Driven by Pulsed Spin Hall Effect-Induced Spin-Transfer Torque"; IEEE Magnetics Letters, vol. 8, Jan. 30, 2017, pp. 1-4.

* cited by examiner

500

SINGLE MAGNETIC-LAYER MICROWAVE OSCILLATOR

CROSS-REFERENCE TO RELATED APPLICATIONS

This application is a U.S. National Stage of International Patent Application No. PCT/EP2019/060394, filed 23 Apr. 2019, which claims priority to Great Britain Patent Application No: 1806425.3, filed on 20 Apr. 2018, the disclosure of which is incorporated herein by reference in its entirety.

TECHNICAL FIELD

This invention relates generally to a method of and system for generating microwave frequency signals in a solid state device. Particularly, but not exclusively, the invention relates to a method of generating microwave voltage or charge current oscillations from a single magnetic layer.

BACKGROUND TO THE INVENTION

The flexible generation of an oscillatory electrical signal (e.g. voltage or current) is an essential building block for information technology and communication (ITC). Modern wireless communications involve transmission of data through wide bandwidth modulated radio frequency (RF) or microwave frequency (MF) channels. This involves generation of high frequency RF/MF carrier signals whose parameters, namely amplitude, frequency and phase, are modulated according to the data intended to be transmitted by the carrier signal. High-frequency signals are typically generated by a local oscillator, such as a voltage-controlled semiconducting oscillator (VCO) whose resonant frequency can be controlled over some range by an input voltage. VCOs typically comprise a crystal having a natural resonant frequency below the intended operation frequency, assisted by a network of semiconductor amplifiers, resistors and voltage controlled diode capacitors (varicaps) to achieve sufficient power and frequency agility. However, modern oscillator technologies cannot easily generate and detect radiation in the spectral range between microwaves and infrared light. Conventional microwave technologies reach at most 100 GHz while optical techniques cover frequencies higher than 30 THz. Despite considerable efforts, efficient, cheap and on-chip technologies in this "Terahertz gap" between 0.3 to 30 THz do not exist.

An emerging technology that has the potential to fill the Terahertz gap is spintronic devices such as spin transfer torque (STT) nano-oscillators, whereby microwave and potentially Terahertz voltages can be generated through current-induced magnetization precession in a multi-layered magnetic structure. FIG. 1 shows a schematic illustration of a typical STT oscillator 100 comprising a relatively thick magnetic reference layer 110 which serves as a spin polariser, a non-magnetic spacer layer 120 and a relatively thin magnetic "free" layer 130. At sufficiently large applied DC currents, $J_{DC}$, angular moment carried by the spin-polarised current emitted from the reference layer 110, upon transmission through the spacer layer 120, exerts sufficient torque (i.e. STT) on the magnetisation vector M2 of the free layer 130 to compensate for magnetic damping losses in the free layer 130 and sustain persistent magnetization precession in the free layer 130. The resulting time varying resistance of the multi-layer stack 100 via the giant magnetoresistance (GMR) effect where the non-magnetic layer 120 is a metal, or tunneling magnetoresistance (TMR) effect where the non-magnetic layer 120 is a dielectric, converts the magnetization precession into microwave voltage oscillations.

STT oscillators exhibit a number of desirable properties over traditional VCOs, such as easier integration with standard silicon technologies, smaller size, and lower cost. However, the requirement of multi-layer magnetic structure and the need for well-controlled interfaces complicates the fabrication process.

Another current-driven mechanism that can manipulate the magnetization of a single magnetic layer is the spin-orbit torque (SOT) effect, in which a current-induced spin polarisation of conduction electrons in materials lacking inversion symmetry causes a torque to be applied to the local magnetization. SOT has been predicted and measured in ferromagnets and antiferromagnets, opening up a wide variety of uses and applications in magnetic oscillators.

Aspects and embodiments of the present invention have been devised with the foregoing in mind.

SUMMARY OF THE INVENTION

According to an aspect of the invention, there is provided a method of generating voltage and/or current oscillations in a single magnetic layer. The magnetic layer has a thickness in a thickness direction. The method comprises applying a direct voltage and/or current to the layer in a longitudinal direction perpendicular to the thickness direction. The method may further comprise developing, creating and/or measuring a longitudinal voltage between a pair of longitudinal voltage leads and/or a transverse voltage between a pair of transverse voltage leads. The magnetic layer may be or comprise a ferrimagnetic material or antiferromagnetic material having a first and second magnetic sub-lattice, wherein the first sub-lattice is a dominant sub-lattice such that the charge carriers at the Fermi energy originate predominantly from the dominant sub-lattice. Charge carriers at the Fermi energy of the material may be spin polarised.

The first and second sub-lattices may have an ordered non-collinear magnetic structure such that the (polar) angle between the local magnetic moment of the first and second sub-lattice is uniform in the layer and an azimuthal angle of the local magnetic moment of the first sub-lattice about the direction of the local magnetic moment of the second sub-lattice varies periodically along one or more spatial directions. This may give a magnetic texture. The wavelength of the magnetic structure or texture may be longer than the Fermi wavelength of charge carriers in the material. The dominant current carrying sub-lattice may lack inversion symmetry.

Alternatively, the first and second sub-lattice may have a disordered non-collinear magnetic structure such that the (polar) angle between the local magnetic moment of the first and second sub-lattice is uniform in the layer and the azimuthal angle is non-uniform and/or random in the layer and the dominant current carrying sub-lattice lacks inversion symmetry.

Alternatively, the first and second sub-lattices may have a collinear magnetic structure at a current density below a first threshold current density and the dominant current carrying sub-lattice lacks inversion symmetry.

Where the ferrimagnetic material or antiferromagnetic material is non-centrosymmetric and/or lacks inversion symmetry, a current may induce a spin polarisation. The transfer of spin angular momentum from the current to the magnetization exerts a "spin-orbit" torque on the local magnetic moment of the current carrying dominant sub-lattice. A current density at or above the first threshold current density may induce a spin torque induced non-collinearity of the first and second sub-lattice.

The application of a DC current through the material induces spatially uniform magnetisation precession in the material, which manifests as a time varying conductivity. The oscillatory conductivity may manifest through the anisotropic magnetoresistance effect. Alternatively or additionally, the oscillatory behaviour may manifest through the anomalous Hall effect. Magnetisation precession may manifest at a current density above a second threshold current density.

The method may further comprise applying a direct voltage or current at or above a second threshold current density. The second threshold current density required to induce magnetisation precession and/or conductivity oscillations in the material may be of the order $10^4$-$10^7$ A/cm$^2$. Alternatively, the second threshold current density required to induce magnetisation precession and/or conductivity oscillations in the material may be of the order $10^5$-$10^7$ A/cm$^2$, $10^6$-$10^7$ A/cm$^2$, or $10^6$-$10^8$ A/cm$^2$. The spin orbit torque may comprise a field-like (reactive) torque and a damping-like (dissipative) torque. The second threshold current density may provide a reactive torque sufficient to overcome the in-plane antisotropy of the magnetic layer. The second threshold current density may provide a dissipative torque sufficient to overcome or compensate the Gilbert damping α (magnetization dissipation).

Where the first and second sub-lattice have a disordered non-collinear magnetic structure such that the (polar) angle between the local magnetic moment of the first and second sub-lattice is uniform in the layer and the azimuthal angle is non-uniform and/or random in the layer and the dominant current carrying sub-lattice lacks inversion symmetry, or where the first and second sub-lattices have a collinear magnetic structure at a current density below a first threshold current density and the dominant current carrying sub-lattice lacks inversion symmetry, the current-induced spin-orbit-interaction energy may be at least 50% of the energy of the first non-collinear excited state.

The magnetic layer may comprise or be constituted of a material comprising a first atomic species, and a second p-block atomic species. The p-block atomic species may be Ga, Ge, Sn, B, Si, Al, In, Pb.

One sub-lattice may comprise atoms with high-Z number. For example, the first sub-lattice may comprise atoms with high-Z number. For example, the atoms may have a Z-number at least as high as Ga (Z=31).

Where the first and second magnetic sub-lattice have a disordered non-collinear magnetic structure such that the (polar) angle between the local magnetic moment of the first and second sub-lattice is uniform in the layer and the azimuthal angle is non-uniform and/or random in the layer and the dominant current carrying sub-lattice lacks inversion symmetry, or wherein the first and second sub-lattices have a collinear magnetic structure at a current density below a first threshold current density and the dominant current carrying sub-lattice lacks inversion symmetry, the dominant sub-lattice may exhibit a spin-orbit splitting energy of at least 100 meV.

Alternatively, the dominant sub-lattice (or subordinate sub-lattice) may exhibit a spin-orbit splitting energy of at least 150 meV, 200 meV or 250 meV. Alternatively, the dominant sub-lattice (or subordinate sub-lattice) may exhibit a spin-orbit splitting energy in the range 50-100 meV, 100-150 meV, 150-200 meV, or any sub range or combination of said ranges.

The first threshold current densities required to induce a spin torque induced non-collinearity may be of the order $10^4$-$10^5$ A/cm$^2$ or $10^5$-$10^6$ A/cm$^2$ or $10^4$-$10^6$ A/cm$^2$.

The frequency of the oscillations may be in the range of substantially 0.1 to 1 THz, or 0.1 to 3 THz, or 0.1 to 10 THz, or 1 to 3 THz or 3 to 10 THz.

The material may exhibit a Gilbert damping factor of approximately 0.01. The material may exhibit a Gilbert damping factor of less than 0.01. The material may have a damping factor of less than 0.05, 0.04, 0.03, 0.02, 0.008, or 0.006.

Where the first and second sub-lattice have a disordered non-collinear magnetic structure such that the (polar) angle between the local magnetic moment of the first and second sub-lattice is uniform in the layer and the azimuthal angle is non-uniform and/or random in the layer and the dominant current carrying sub-lattice lacks inversion symmetry, the probability of inter-sub-lattice scattering involving spin flip may be greater than that of inter-sub-lattice scattering not involving spin flip.

The material may have an inter-sub-lattice (neighbouring spin belonging to different sub-lattices) exchange parameter that is weaker than at least one intra-sub-lattice (neighbouring spin belonging to the same sub-lattice) exchange parameter.

The method may further comprise making an electrical short circuit between the pair of transverse voltage leads.

The magnetic layer may be or comprise a ferrimagnet and/or exhibit ferrimagnetic behaviour. Additionally or alternatively, the magnetic layer may be or comprise a half-metallic ferrimagnet.

The magnetic layer may exhibit a spin polarisation of at least 50%. The magnetic layer may exhibit a spin polarisation of at least 60%, 65%, 70%, 75%, 80%, 85%, 90% or 95%. The magnetic layer may exhibit close to 100% spin polarisation. Optionally or preferably, the magnetic layer exhibits a spin polarisation of at least 50%, 60%, 65%, 70%, 75%, 80%, 85%, 90% or 95% at 300 Kelvin.

Suitable materials for the magnetic layer may include, but are not limited to MnRuGa (MRG), Mn$_2$FeGa, and Mn$_{3-x}$Ga (x in the range 0 to 1). The magnetic layer may be or comprise Mn$_2$Ru$_x$Ga, where x may be in the range 0.4-0.6, or 0.4 to 0.7, for example x may be approximately 0.4, 0.45, 0.5, 0.55, 0.6, 0.65, or 0.7.

The magnetic layer may exhibit a magnetic texture with a characteristic texture wavelength. The magnetic texture may be smooth on the scale of the Fermi wavelength of the charge carrier in the magnetic layer, such that the texture wavelength is greater than the Fermi wavelength.

The Fermi wavelength of the charge carriers may be on the order of 0.1-1 nm. The magnetic texture wavelength may be in the range 1-1000 nm. The magnetic texture wavelength may be in the range 1-100 nm, 100-200 nm, 200-300 nm, 300-400 nm, 400-500 nm, 500-600 nm, 600-700 nm, 700-800 nm, 800-900 nm, 900-1000 nm, or any sub range or combination of said ranges.

The magnetic texture wavelength may be equal to the period of the variation of the azimuthal angle of the local magnetic moment of the first sub-lattice along the one or more spatial directions. The texture wavelength may be 5-10 unit cell parameters, 100-200, or 100-1000 unit cell parameters.

The frequency of the oscillatory current and/or voltage may be in the range 1 GHz 300 GHz, 300-1000 GHz, 1000-3000 GHz, 3-10 THz, or any sub-range or combination of subranges of said ranges.

The transverse voltage scales inversely with the thickness of the material or magnetic layer. The thickness of material may be in the range 10-100 nm or 10 nm to 500 nm, or 10 nm to 1000 nm. The width of the material may be in the range 500 nm 10 microns or 500 nm to 100 microns. The maximal thermal power dissipation scales with the cross-section of the material, down to the limit of electron scattering lengths (~10 nm).

The method may comprise of applying a current density to the magnetic layer equal to or greater than a second threshold current density greater than the first threshold to compensate or overcome the Gilbert damping.

According to a second aspect of the invention, there is provided a system comprising a device for generating voltage and/or current oscillations according to the method of the first aspect.

The device may comprise a single magnetic layer through which a current or voltage is applied a longitudinal (in-plane) direction perpendicular to a thickness direction of the layer. The device may comprise a pair of longitudinal and/or transverse voltage leads for measuring a respective longitudinal and/or transverse voltage developed along and/or across the magnetic layer. The device may comprise a pair of bias leads for biasing the signal magnetic layer with a bias voltage and/or current.

The magnetic layer may be or comprise a ferrimagnetic or antiferrimagnetic material having a first and second magnetic sub-lattice. The first sub-lattice may be a dominant sub-lattice such that the charge carriers at the Fermi energy originate predominantly from the dominant sub-lattice and the charge carriers at the Fermi energy are spin polarised. The dominant current carrying sub-lattice may lack inversion symmetry.

The first and second sub-lattices may have an ordered non-collinear magnetic structure such that the (polar) angle between the local magnetic moment of the first and second sub-lattice is uniform in the layer and an azimuthal angle of the local magnetic moment of the first sub-lattice about the direction of the local magnetic moment of the second sub-lattice varies periodically along one or more spatial directions giving a magnetic texture. The wavelength of the magnetic structure may be longer than the Fermi wavelength.

Alternatively, the first and second sub-lattice may have a disordered non-collinear magnetic structure such that the (polar) angle between the local magnetic moment of the first and second sub-lattice is uniform in the layer and the azimuthal angle is non-uniform and/or random in the layer. The dominant current carrying sub-lattice may lack inversion symmetry.

Alternatively, the first and second sub-lattices may have a collinear magnetic structure at a current density below a first threshold current density. The dominant current carrying sub-lattice may lack inversion symmetry.

The system may comprise a means for applying the voltage and/or current to the device. For example, the system may comprise a power supply such as a battery or voltage/current source.

The system may comprise a means for measuring the longitudinal and/or transverse voltage. For example, the system may comprise a voltage measuring unit and/or a current measurement unit coupled to the voltage leads and/or bias leads.

The system may further comprise a means for extracting the generated voltage and/or current oscillations from the longitudinal and/or transverse voltage. The means for extracting the generated voltage and/or current oscillations may be or comprise a bias tee coupled to the longitudinal and/or transverse voltage leads. Alternatively or additionally, the means may be or comprise a capacitor coupled to one or more of the longitudinal and/or transverse voltage leads.

The magnetic layer may be or comprise a ferrimagnet, and/or a half-metallic ferrimagnet. The magnetic layer may be or comprise MnRuGa, MnFeGa, or MnGa.

The frequency of the oscillations may be in the range of substantially 0.1 to 1 THz, or 0.1 to 3 THz, or 0.1 to 10 THz, or 1 to 3 THz, or 3 to 10 THz.

Features which are described in the context of separate aspects and embodiments of the invention may be used together and/or be interchangeable. Similarly, where features are, for brevity, described in the context of a single embodiment, these may also be provided separately or in any suitable sub-combination. Features described in connection with the device may have corresponding features definable with respect to the method(s) and these embodiments are specifically envisaged.

BRIEF DESCRIPTION OF DRAWINGS

In order that the invention can be well understood, embodiments will now be discussed by way of example only with reference to the accompanying drawings, in which:

FIG. 4b shows the corresponding magnetic texture associated with the magnetisations shown in FIG. 4a;

DETAILED DESCRIPTION

Figure 1:
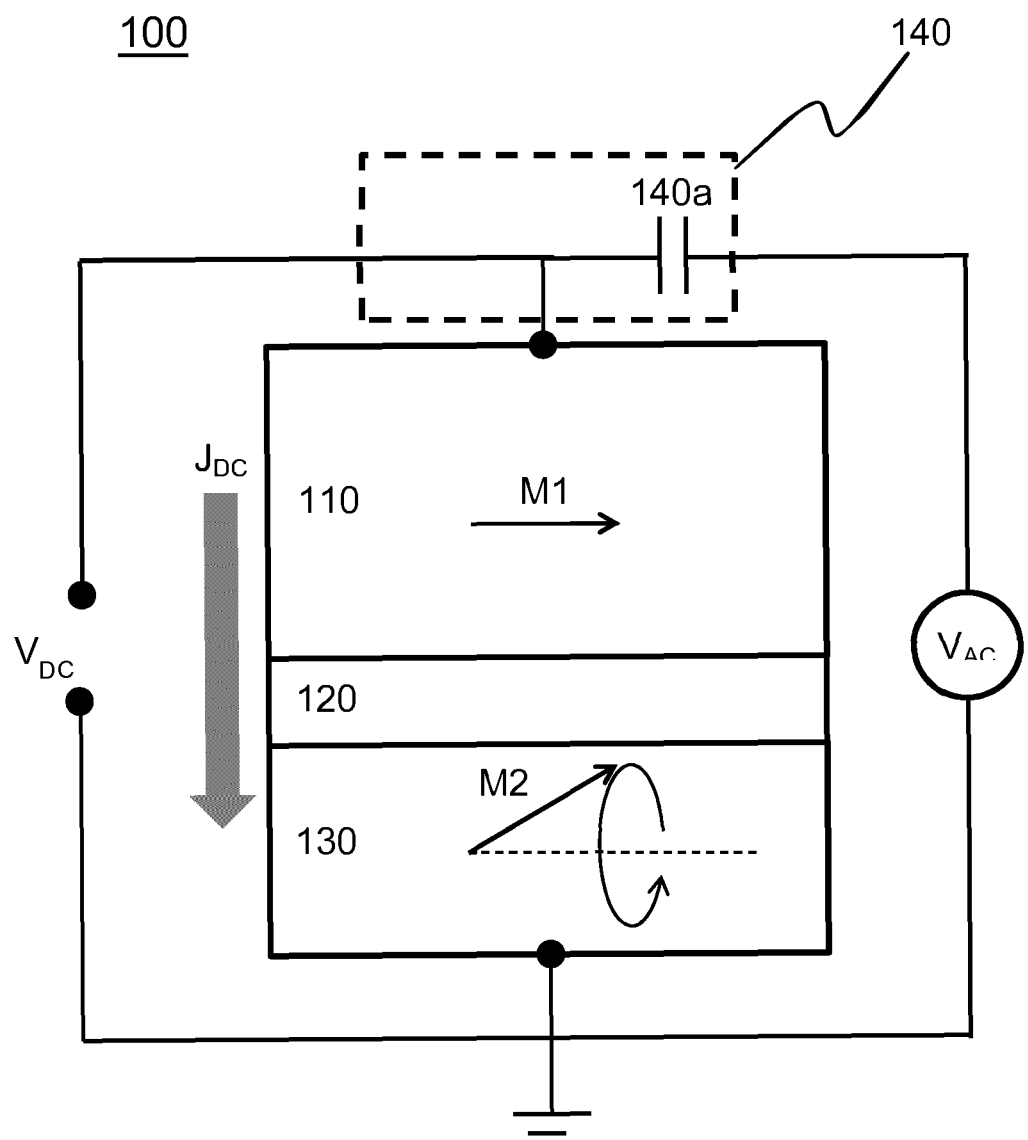
FIG. 1 shows a schematic illustration of a typical spin transfer torque oscillator known in the art.

Existing spin-transfer torque (STT) devices require at least two separate magnetic layers having a non-collinear magnetisation structure, separated by a non-magnetic spacer layer, to generate a magnetic torque and alter the magnetisation of a magnetic layer, such as spin valves (GMR) and magnetic tunnel junctions (TMR). As shown in FIG. 1, upon biasing the STT device 100 with a voltage $V_{DC}$, a current $J_{DC}$ is passed through the structure 100, from a magnetic reference layer 110 where it becomes spin polarised (with spins aligned with the magnetisation M1), and into a magnetic free layer 130. The spin polarised current emanating from the magnetic reference layer 100 transfers spin angular momentum to the free layer 130, producing a spin transfer torque on the magnetisation M2 of the free layer 130, proportional to $J_{DC}$, which can alter the magnetisation vector M2 of the free layer 130 and/or induce magnetization precession if the STT compensates or overcomes the magnetic damping (Gilbert damping) in the free layer 130. The typical current densities required to induce magnetisation switching and/or magnetisation precession is of the order $10^7$ A/cm$^2$. The resulting change in the magnetisation can be detected by exploiting magnetoresistive effects such as giant magnetoresistance (GMR) or tunneling magnetoresistance (TMR).

A magnetic torque can also be generated in a single magnetic layer from another current-driven mechanism based on the spin-orbit interaction (SOI). This effect, known as spin-orbit torque (SOT), is due to a net spin-orbit effective magnetic field $B_{SO}$ resulting in a current-induced spin accumulation (in momentum space) that is non-collinear to the local magnetisation m of the magnetic layer. Thus, in contrast to STT, SOT does not rely on two non-collinear, independent ferromagnetic layers 110, 130.

The current-induced SOI effects arise in materials (magnetic and non-magnetic) that lack inversion symmetry, such as bulk inversion asymmetry (BIA) (e.g. in zincblende crystal structures, where this is a feature of the local order and the crystal potential), or lack inversion symmetry in the macroscopic electrostatic potential of the structure, known as structural inversion asymmetry (SIA) (e.g. in two-dimensional layers and/or heterostructures). The inversion asymmetry lifts the orbital-degeneracy of the conduction electrons and generates a spin splitting (via the SOI), which is dependent on the direction of the electron wave-vector k. By analogy to the Zeeman effect, the k-dependent SO spin splitting can be considered as resulting from a k-dependent effective SO field $B_{SO}(k)$, whose magnitude is proportional to the strength of the SOI. The spin orientation aligns with $B_{SO}(k)$. For the case of SIA in a two-dimensional layer, $B_{SO}(k)$ points in a direction transverse to k, which itself is confined within the plane of the structure. At equilibrium (J=0), $B_{SO}(k)$ averaged over k at the Fermi energy is zero, because the average k is zero. However, under non-equilibrium conditions (|J|>0) the average k is non-zero and proportional to J producing a net $B_{SO}(k)$ pointing in a direction transverse to J. This leads to a net spatially uniform spin accumulation $<\delta\sigma>$ (transverse accumulation in k-space) proportional to J and the strength of the SOI.

The above current-induced spin accumulation occurs in both magnetic and non-magnetic materials with SOI. In the case of a magnetic material, $B_{SO}(k)$ is not necessarily dependent on the direction of the local magnetisation m. Although at equilibrium the electron spins tend to align with m, a non-collinear current-induced spin accumulation $<\delta\sigma>$ can exert a torque (SOT) on m (i.e. in 3d itinerant ferromagnets through the s-d exchange interaction) that can induce magnetisation switching of the magnetic material. Candidate magnetic materials with high SOI may rely on either high Z-number atoms, or on sufficiently low crystalline symmetry (as, for example, induced by p-type hybridisation). SOT has been demonstrated to induce magnetisation switching in single layers of antiferromagnetic metals and dilute ferromagnetic semiconductors. However, the SOT effect in single ferromagnetic or ferrimagnetic layers has not been shown to induce magnetisation precession (or sustained magnetic oscillations).

According to an aspect of the present invention, the functionality provided by complex magnetic layer stacks in the standard case of STT oscillators is here achieved in a single magnetic layer by making use of the unusual properties of specific ferrimagnets or antiferromagnets.

The key requirements for the generation of sustained magnetic oscillations and an oscillatory conductivity (voltage and/or current) in a single ferrimagnetic or antiferromagnetic layer are that the charge carriers at or near the Fermi energy are (i) highly spin polarised, and (ii) originate from predominantly one of the magnetic sub-lattices (see below).

Figure 2:
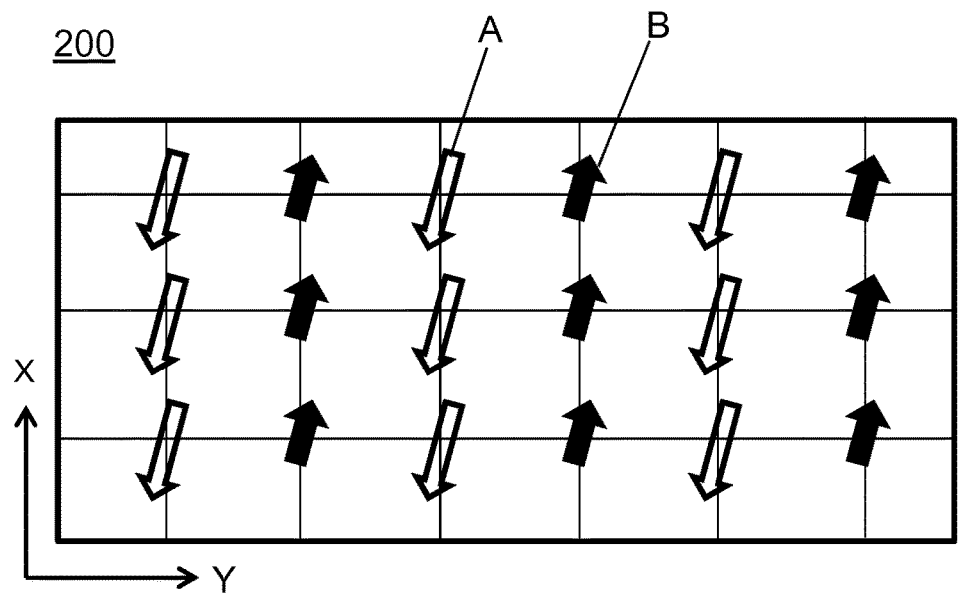
FIG. 2 shows a schematic illustration of a ferrimagnet with collinear magnetic structure.

FIG. 2 shows a simplified schematic illustration of the magnetic structure of a collinearly ordered ferrimagnetic layer 200. The local magnetic moments m of the magnetic ions are depicted by arrows, whose length represents the magnitude. The ferrimagnetic layer 200 comprises two (or more) interpenetrating sub-lattices A and B of magnetic ions. The magnetic moments of the two sub-lattices A, B are aligned substantially anti-parallel to each other, i.e. antiferromagnetically coupled. However, unlike an antiferromagnet, each sub-lattice A, B of the ferrimagnetic layer 200 is crystallographically inequivalent, that is, the magnetic ions on sub-lattice A may be of a different chemical element or positioned at a different crystallographic site to the magnetic ions on sub-lattice B. As such, the magnetic moments on each sub-lattice A and B may have unequal magnitude, resulting in a net magnetization of the ferrimagnetic layer 200. Although the magnetic moments $m_A$, $m_B$ on each sub-lattice A, B are generally unequal in magnitude, these can be made to compensate as a function of temperature and other factors.

Electrical transport through the ferrimagnetic layer 200 can be described phenomenologically in terms of separate independent conduction channels for the electrons of majority spin (parallel to the magnetization of the dominant sub-lattice) with a conductivity $\sigma_\uparrow$, and electrons of minority spin (anti-parallel to the latter) with a conductivity $\sigma_\downarrow$, leading to a total conductivity $\sigma=\sigma_\uparrow+\sigma_\downarrow$ (where $\sigma_\uparrow\neq\sigma_\downarrow$). The density of states (DoS) for each spin channel at the Fermi energy is not equal due to the crystallographic difference between sub-lattice A and B. As such, charge current passed through the ferrimagnetic layer 200 is highly spin polarised (similar to current in a ferromagnetic layer).

Each of the sub-lattices A, B contribute to the electronic band structure and DoS, however, unlike in the case of a simple antiferromagnet, the DoS for sub-lattice A is not simply a spin-reflection of the DoS of sub-lattice B. As a result, the DoS at the Fermi energy may be partially or completely dominated by one of the two magnetic sub-lattices A, B of the ferrimagnetic layer 200. When the DoS is dominated by one of the sub-lattices A, B at the Fermi energy, the conduction band may be described by a single effective spin-polarised carrier (one spin channel). In other words, charge carriers flowing through the ferrimagnet effectively only "see" the dominant sub-lattice or behave as if only the dominant sub-lattice were present.

An example of a ferrimagnetic, highly (fully) spin-polarised material, with broken inversion symmetry is $Mn_2Ru_xGa$ [H. Kurt et al., Physical Review letters 112, 027201 (2014)]. $Mn_2Ru_xGa$ meets the requirements for exhibiting SOT effects. The large magnetocrystalline anisotropy and the lack of local inversion symmetry existing in $Mn_2Ru_xGa$ imply considerable SOT, which is demonstrated in the experimental section below.

Figure 3:
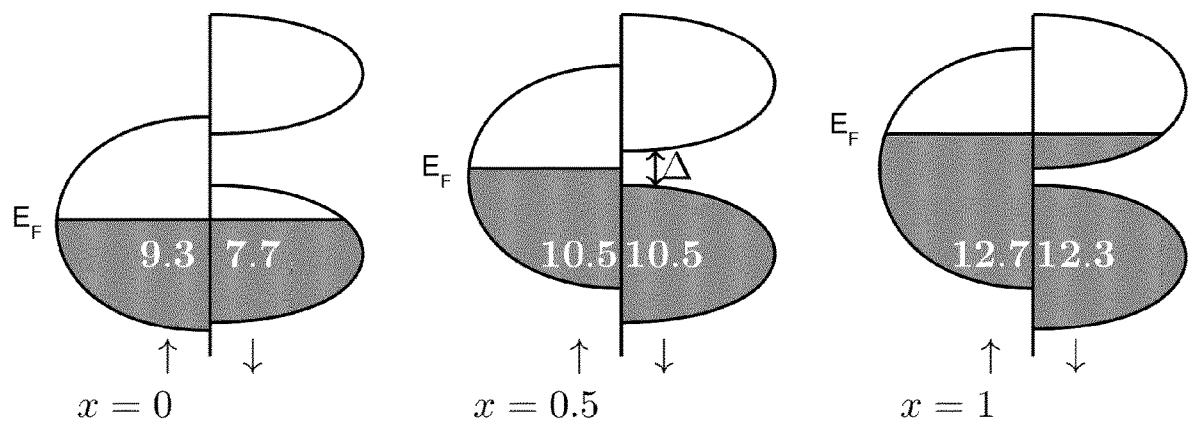
FIG. 3 shows a schematic illustration of the density of states of a ferrimagnet.

FIG. 3 shows an example DoS for $Mn_2Ru_xGa$, where the DoS for each spin channel is indicated by the up and down arrow (adapted from H. Kurt et al., Physical Review letters 112, 027201 (2014)). The numbers in white indicate the electron occupancy of each spin channel (i.e. an indication of the spin population in each channel).

The example material, $Mn_2Ru_xGa$, is a ferrimagnetic half-metal with a gap A in the DoS for one spin channel (spin down, in this example). The illustration shows that by varying the Ru content x, the Fermi energy $E_F$ can be tuned to lie within the gap, where the material would be fully spin polarised (i.e. all charge carriers at the Fermi energy originating from one spin band). Suitable Ru contents x lie in the range between substantially 0.4 to 0.7.

Figure 4A:
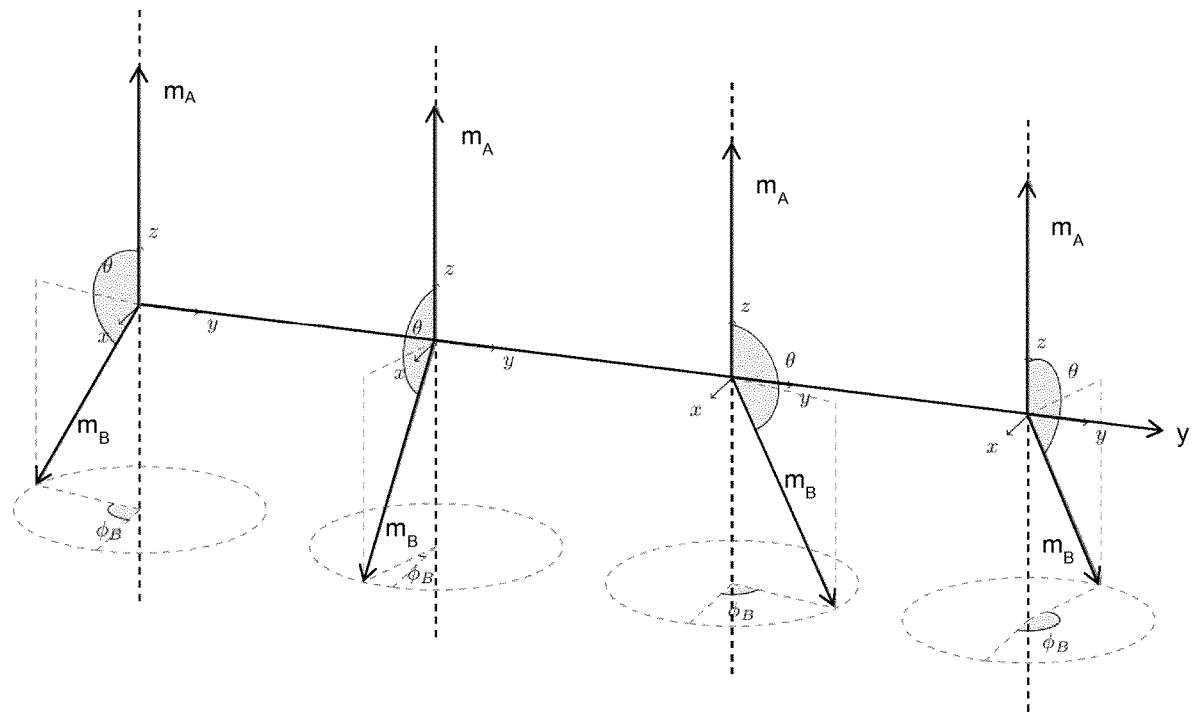
FIG. 4a shows an example of relative orientations of the magnetisations of two sub-lattices of a ferrimagnet at different locations in the ferrimagnet.
Figure 4B:
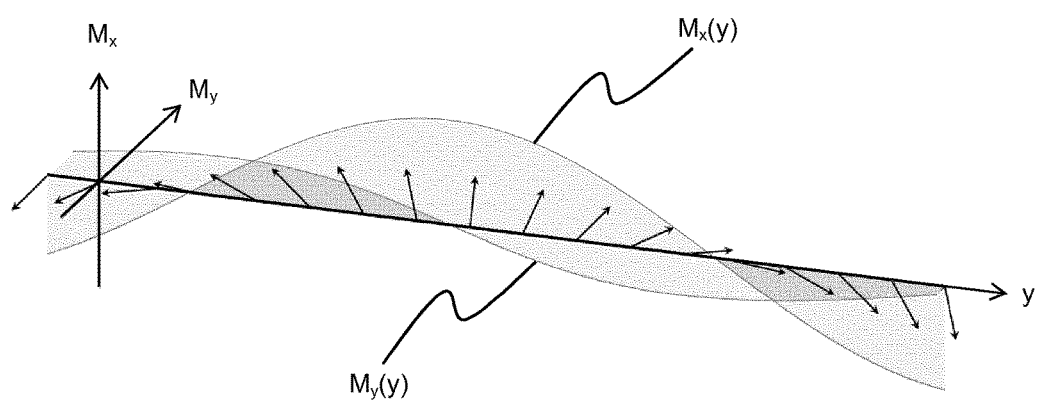

Certain ferrimagnets may have a non-collinear magnetic structure and/or exhibit a magnetic texture. FIG. 4a shows an example of a ferrimagnetic layer 300 with a non-collinear magnetic structure according to a first embodiment. The local magnetic moments $m_A$, $m_B$ of each respective sub-lattice A, B are shown at various positions along the y-axis, where the local magnetisation $m_A$ of sub-lattice A is shown along the z-axis for simplicity of drawing. In a ferrimagnetic layer 300, the magnetic moments $m_A$, $m_B$ of each sub-lattice A, B are not aligned anti-parallel, such that there exists a polar angle $\theta \neq 180°$ between them. In the example shown in FIG. 4a, the magnetic structure is an ordered non-collinear one, where the polar angle $\theta$ is substantially spatially uniform across the ferrimagnetic layer 300. There also exists an azimuthal angle $\phi$ between the local magnetization of one of the sub-lattices, in this case $m_B$ of sub-lattice B, and an axis normal to the direction of the local magnetization of the other of the two sub-lattices, in this case the x-axis. The azimuthal angle $\phi_B$ may not be spatially uniform across the ferrimagnetic layer 300 and may vary along one or more spatial directions. In FIG. 4a, the azimuthal angle $\phi_B$ varies periodically along the y direction, in this case by 90° for each unit of translation along the y direction. The ferrimagnetic layer 300 therefore exhibits a magnetic texture with a characteristic wavelength $\lambda_{texture}$ equal to the period of the variation of $\phi_B$ (typically 5-10 crystallographic unit cell parameters, if the noncollinearity is driven by magnetocrystalline anisotropy, and much more, e.g. 100-1000, if it is Dzyaloshinskii-Moriya exchange driven). The magnetic texture resulting from the sub-lattice magnetisations shown in FIG. 4a is illustrated in FIG. 4b, which shows the periodic spatial variation of the x and y components of the net magnetisation M by the curves $M_x(y)$ and $M_y(y)$, respectively.

Although the local magnetisation $m_A$ of sub-lattice A is shown along the z-axis in FIG. 4a, both $m_A$ and $m_A$ may be at a polar angle $\theta_A$ and $\theta_B$ with respect to the z-axis, such that the angle between $m_A$ and $m_A$ may be written more generally as $\theta_A - \theta_B$. In addition, there may be a situation whereby either or both of $\theta_A$ and $\theta_B$ may vary periodically (or not) along one or more spatial directions. In a further example, both $\theta$s and $\phi$s may vary periodically (or not) along one or more spatial directions.

In the example of FIG. 4a, sub-lattice B may be the dominant sub-lattice at the Fermi energy. Provided that the magnetic texture is smooth on the scale of the Fermi wavelength $\lambda_F$ (on the order of 0.1-1 nm), such that it substantially greater than the Fermi wavelength (i.e. $\lambda_{texture} \gg \lambda_F$), charge carriers will, when moving in the time-varying magnetic field (i.e. in the moving frame) align their spins (adiabatically) to the spatially varying net magnetisation M (represented by the short arrows in FIG. 4b) and thus acquire an oscillatory behaviour. This is illustrated in FIG. 4b by the short arrows. Note that these spins all lie in the x-y plane of the layer 300. This can be understood by considering that, a spin initially aligned to the net magnetisation in a particular part of the texture, $M_1$, will experience a torque when it reaches a different part of the texture having different net magnetisation $M_2$, which is proportional to its cross product with $M_1$.

The current-induced change of spin orientation is accompanied by a transfer of spin angular momentum to the dominant magnetic sub-lattice, sub-lattice B in this example. This in turn provides an opposing torque, acting on the local magnetisation of the dominant sub-lattice in question (which is proportional to its cross product with the current density j which is the x-y plane), that provides a back-action that alters the polar angle $\theta$ between $m_A$ and $m_B$. Under steady-state conditions, since the spin orientation always follows the magnetic texture, the sub-lattice torque is spatially uniform. A general form of the current induced SOT in the local approximation is $T_{AB}=m_{A,B} \times H_{AB}(m_A, m_B, j)$, where $H_{A,B}$ is the effective field that depends on the magnetisation direction and is induced by the current density j.

As such, the effect of the magnetic texture in ferrimagnetic layer 300 on the spin orientation is similar to the operation principle of a STT device 100, as shown in FIG. 1. However, by contrast to the STT device 100 where the torque is provided by two separate non-collinear magnetic layers 110 and 130, the torque in ferrimagnetic layer 300 is provided by the non-collinear magnetic sub-lattices A and B.

As with a STT oscillator 100, if sufficient spin angular momentum is transferred from the spins to the dominant sub-lattice (e.g., B in this example), magnetisation precession can be induced in the ferrimagnetic layer 300. As the sub-lattice torque is spatially uniform across the layer 300, such oscillations are in phase across the layer 300. The oscillation frequency is given by the ratio $v_F/\lambda_{texture}$, where $v_F$ is the Fermi velocity of the charge carrier. Assuming a Fermi velocity for a typical metal in the range $0.1-2 \times 10^6$ m/s and a magnetic texture wavelength $\lambda_{texture}$ in the range 1-1000 nm, this gives an oscillation frequency in the range 0.1 THz 2000 THz.

The transfer of spin angular momentum and hence the sub-lattice torque is proportional to the current density and to the degree of spin polarisation of the current. These two parameters are interrelated, such that the lower the spin polarisation of the current, the more current density is required to provide sufficient sub-lattice torque. High spin polarisation is thus advantageous in order to reduce the operating current density of a device. It follows that, as with STT devices, a minimum or threshold current density is required to observe any sub-lattice magnetisation dynamics.

The threshold current densities required to induce magnetisation precession in ferrimagnetic layer 300 may be of the order $10^4$-$10^7$ A/cm$^2$.

In an alternative embodiment, ferrimagnetic layer 300 may have a collinear magnetic structure in the ground state (i.e. when no current is applied) such that $\theta=180°$. Where the dominant current carrying sub-lattice (present at the Fermi energy), e.g. sub-lattice B, of the ferrimagnetic layer 300 lacks inversion symmetry, current-induced transverse spin accumulation in the presence of SOI may be utilised to exert a SOT on the magnetisation of the dominant current-carrying sub-lattice B and introduce an angle $\theta \neq 180°$. In this way, the current flowing through the ferrimagnetic layer 300 may transform the collinear magnetic structure into a non-collinear, non-equilibrium magnetic structure (e.g. "frozen magnon"), similar to that shown in FIGS. 4a and 4b. The non-collinear, non-equilibrium magnetic structure is an ordered one, similar to that shown in FIGS. 4a and 4b. As such, an oscillatory magnetisation may manifest in the same way as described in relation to ferrimagnetic layer 300.

The strength of the SOI felt by the charge carriers should be on the order of the static splitting $\Delta$ (see FIG. 3) in the density of states, preferably in the range 100 meV to 300 meV. This condition may be met by increasing the SOI, example by introducing high-Z atoms, or by hybridizing the wave function of the dominant current carrying sub-lattice B with a nearby p-block element, such as Ga, Ge, Sn, B, Si, Al, In, Pb. Additionally or alternatively, the gap A may be reduced by decreasing the inter sub-lattice exchange energy.

The threshold current densities required to induce a spin torque induced non-collinearity may be of the order $10^4$-$10^5$ A/cm$^2$.

Provided that the charge current is highly spin polarised (e.g. >50%) and originating from predominantly one of the two magnetic sub-lattices A, B of the ferrimagnetic layer 300, the oscillatory magnetisation behaviour may manifest as a time-varying change in the conductivity (or resistivity) of the ferrimagnetic layer 300. For example, this may manifest through the anisotropic magnetoresistance (AMR) effect, whereby the longitudinal component of the electrical conductivity (or resistivity) depends on the relative angle $\theta$ between the net magnetisation direction M and the electrical current j. Alternatively or additionally, the oscillatory behaviour may manifest through the anomalous Hall effect, whereby the transverse component of the electrical conductivity (or resistivity) depends on the out-of-plane component (e.g. the z-component) of the magnetisation, $M_z$. In the example ferrimagnetic layer 300 shown in FIG. 4a, assuming the current is fixed in the direction y, the direction of the net magnetisation and the magnitude of $M_z$ will vary with the sub-lattice torque induced variation of $\theta$.

The magnitude of the effect, or the depth/amplitude of the oscillations in the conductivity is determined by the change in angle $\theta$. The degree of spin polarisation also affects the amplitude of the conductivity oscillations, since only spin polarised charge carriers contribute the oscillatory component of the conductivity and any unpolarised charge carriers will contribute to an offset signal. A ferrimagnet with 100% spin polarisation is ideal. 100% spin polarisation is expected for certain half metallic ferrimagnets. For example, the ferrimagnet $Mn_2Ru_{0.5}Ga$ shown in the middle panel of FIG. 3 is expected exhibit 100% spin polarisation. However, a spin polarisation of greater than 50% would be sufficient. Spin polarisations of greater than 50% have been reported at room temperature in half-metallic $Mn_2Ru_xGa$ layers (see H. Kurt et al. Physical Review Letters 112, 027201 (2014)).

It is also necessary to overcome the intrinsic damping (i.e. Gilbert damping) in the ferrimagnet to observe magnetisation precession. Gilbert damping is characterised by a damping factor $\alpha$. Consequently, a low damping factor $\alpha$ is advantageous. The damping factor is a dimensionless coefficient that enters directly into the equations that govern the magnetisation dynamics (e.g. the Landau-Lifshitz-Gilbert equation). For example, damping factors of $\alpha<0.01$ may be required to observe magnetisation precession. It is also necessary for the gain-bandwidth product (GBP) to be greater than 1 to observe magnetisation precession. If the damping factor $\alpha$ is too high, the gain band width product (GBP) will be too low, e.g. <1. Damping, net magnetic moment, spin polarisation and anisotropy are all affected by temperature. As it is expected that realistic oscillators would operate above ambient temperature, some welcome gains in terms of damping can occur, as inhomogeneity (anisotropy) driven magnon generation is suppressed at high temperatures.

Sustained current controlled magnetic oscillations with tunable amplitudes and frequencies in a single antiferromagnetic and ferrimagnetic layer (such as $Mn_2Ru_xGa$) has been demonstrated theoretically via a phenomenological approach in R. E. Troncoso et al. Physical Review B, 99, 054433 (2019).

Figure 5:
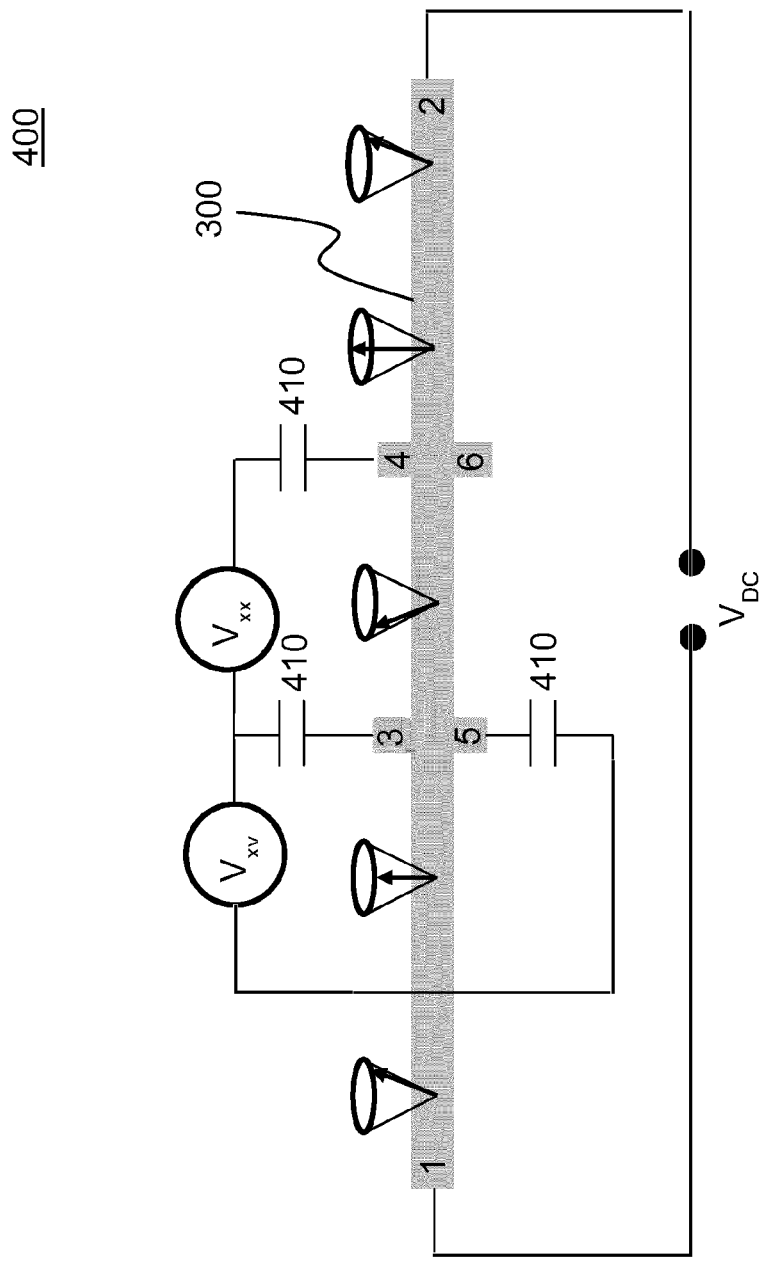
FIG. 5 shows an example single layer oscillator.

The conductivity or resistivity of ferrimagnetic layer 300 may be determined using standard resistance measurements, e.g. by passing current through the layer 300 and measuring a voltage. FIG. 5 shows a schematic diagram (plan view) of a single layer ferrimagnetic oscillator 400 comprising a ferrimagnetic layer 300. In this example, the ferrimagnetic layer 300 is shown in a conventional Hall bar geometry. However, it will be appreciated that the ferrimagnetic layer 300 may be or comprise any arbitrary shape. In another example, a Hall cross geometry may be used. The Hall bar geometry is particularly advantageous in separating the longitudinal and transverse conductivity components. A DC current is applied between ports 1 and 2. The current may be applied using a DC voltage source, such as a battery. The small cones with arrows depict the oscillatory behaviour of the charge carrier spin along the length of the device 400. A longitudinal voltage $V_{xx}$ may be measured between ports 3 and 4 or 5 and 6. A transverse voltage $V_{xy}$ may be measured between ports 3 and 5 or 4 and 6. The anisotropic magnetoresistance may be measured through while the anomalous Hall effect (AHE) may be measured through $V_{xy}$. To filter out the DC voltage component, the voltage ports 3, 4, 5, 6 may be coupled to a wave-guide, antenna or receiver unit, or voltage measuring unit via a capacitor 410.

In an embodiment, external feedback may be used to enhance the back-action provided by the current induced torques. In one example, the two sides of the Hall bar, e.g. ports 3 and 5 and/or ports 4 and 6, may be electrically short-circuited. In this way, the presence of a transverse voltage $V_{xy}$ will drive a charge transverse charge current between the respective ports. Oscillations in the transverse charge current will be in phase with the oscillations in the longitudinal and transverse conductivity, thus providing positive feedback.

The oscillatory conductivity may also manifest as negative differential conductance. For applied current densities below a critical current density required to induce magnetisation dynamics, the current-voltage relationship may be substantially linear, in accordance with Ohm's law. At or above the critical current density, the average conductivity may exhibit a drop (i.e. increased resistance) due to increased momentum scattering associated with the magnetisation dynamics. This manifests as a turnover or region of non-linearity in the current-voltage relationship.

In another embodiment, the ferrimagnetic layer 300 may have a non-collinear magnetic structure such that θ≠180°, but there is no long range order such that the azimuthal angle ϕ varies randomly across the layer 300. This is in contrast to the case of FIG. 4b where the angle ϕ varies periodically. The polar angle θ may be spatially uniform. In this case, assuming again that sub-lattice B is the dominant current carrying sub-lattice, a torque may be produced on the non-current carrying sub-lattice A by charge carriers scattering from sub-lattice B to sub-lattice A with spin flip. The probability of scattering between the sub-lattices is dependent on the angle θ. In this way, the more spins that scatter, the more the angle θ is changed. In turn, the more 0 is changed by the inter sub-lattice spin flip scattering, the higher probability of inter-sub-lattice spin-flip scattering. This increases the scattering cross-section and thus changes the angle θ. The probability of spin flip scattering should be higher than that of non-spin flip scattering processes.

The nonlinear changes in internal scattering coefficients, would thus result in a region of negative differential conductivity, at sufficiently high current densities (leading to an appreciable change in the cone/polar angle θ). The frequency of oscillation in this case would be determined by extrinsic parameters, such as wave-guide dispersion, if the structure is forming a part of a waveguide system, or RC time-constants in the case of capacitive coupling to an antennae structure.

Spin-flip scattering is a SOI driven process. As such, a necessary requirement is that the SOI felt by the charge carriers is on the order of the static splitting Δ (see FIG. 3) in the density of states in order to scatter across it. This condition may be met by increasing the SOI, example by introducing high-Z atoms, or by hybridizing the wave function of the dominant current carrying sub-lattice B with a nearby p-block element, such as Ga, Ge, Sn, B, Si, Al, In, Pb. Additionally or alternatively, the gap A may be reduced by decreasing the inter sub-lattice exchange energy.

Suitable ferrimagnetic materials for the oscillator 400 may include, but are not limited to MnRuGa, Mn₂FeGa, Mn$_{3-x}$Ga.

The ferrimagnetic structure may be an ordered non-collinear one (e.g. the first embodiment), an ordered collinear one (e.g. the second embodiment), or a disordered non-collinear one (e.g. the third embodiment). In the latter two cases, the presence of SOI is necessary.

A condition for the observation of an oscillatory voltage and/or current in a single ferrimagnetic layer is a sufficiently small damping factor α. This ensures the system will produce oscillations, for an arbitrarily small SOT. If the damping factor is too high (e.g. >>0.01) the gain-bandwidth product (GBP) will be too low for practical uses, as the bandwidth of the oscillator will be adversely affected. GBP >1 is a necessary condition for the observation of oscillations.

The invention greatly simplifies the production and integration of an oscillator in existing technology by reducing the number magnetic layers required (e.g. one layer compared to three layers in existing STT devices). In addition, the range of frequencies accessible by the proposed method greatly exceeds that achievable using existing semi-conductor and magnetic based technologies.

Experimental Section: Measurements of Spin-Orbit Torque in MnRuGa

In the following we show that spin-orbit torque in a single layer of the highly spin-polarized compensated ferrimagnet Mn₂Ru$_x$Ga is remarkably efficient at generating spin-orbit fields $\mu_0 H_{eff}$ (where $\mu_0$ is the vacuum permittivity) which approach $0.1 \times 10^{-10}$ Tm²/A in the low-current density limit almost a thousand times the Oersted field, and one to two orders of magnitude greater than the effective fields in heavy metal/ferromagnet bilayers.

To date, there has been no quantitative measurement of the damping-like (dissipative) component of the spin-orbit torque in homogeneously magnetized ferrimagnetic or antiferromagnetic single layers. In a single layer of half-metallic Mn₂Ru$_x$Ga with x=0.7 (MRG) we show that both the field-like (reactive) and damping-like (dissipative) components of the torque are almost two orders of magnitude greater than those obtained in bilayer ferromagnet/heavy metal systems, or in metallic ferromagnets and semimagnetic semiconductors. From a harmonic analysis of the anomalous Hall effect, taking into account of the thermal contributions from the anomalous Nernst effect, we show that the dissipative component of the spin-orbit torque is sufficient to sustain self-oscillations in the magnetization.

Figure 6:
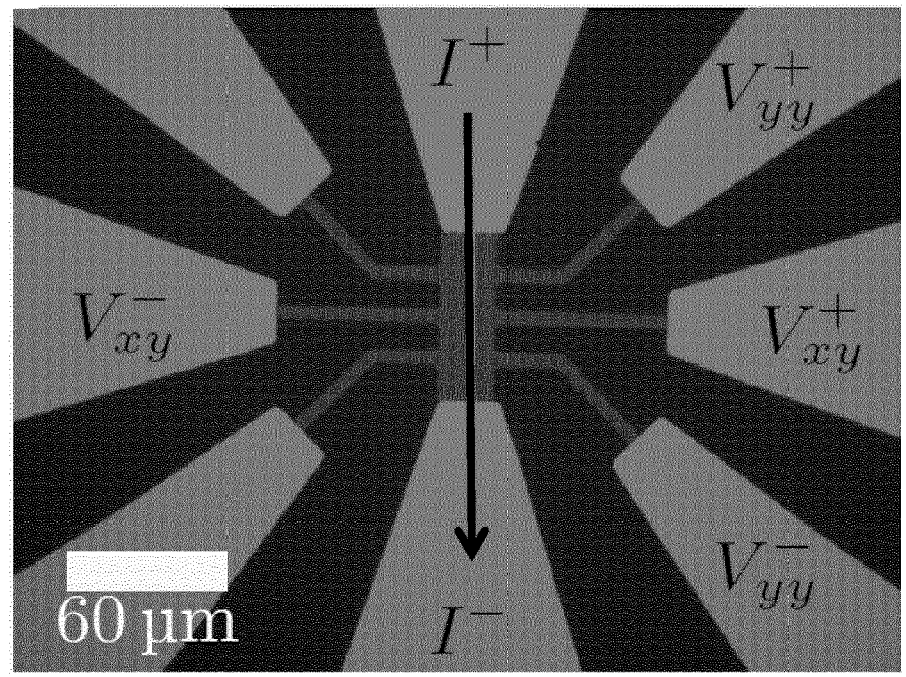
FIG. 6 shows an example single layer MRG Hall structure.

FIG. 6 shows an image of a device 400 comprising a thin film of MRG (approximately 30 nm thick) in a Hall bar geometry. The long axis of the Hall bar (along which the bias current j is applied) is parallel to the MRG [010] or [100] axis. Current is applied between the electrical contacts labelled I(+) and I(−) as indicated by the arrow, and transverse and longitudinal voltages are measured between electrical contacts labelled $V_{xy}(+)$ and $V_{xy}(-)$ and $V_{yy}(+)$ and $V_{yy}(-)$, respectively. As discussed with device 400, the AMR may be measured through the longitudinal voltage, while the AHE may be measured through the transverse voltage.

The MRG (x=0.7) was grown on a single-crystal MgO (001) substrate by magnetron co-sputtering from Mn₂Ga and Ru targets in a 'Shamrock' deposition cluster tool at a substrate temperature approximately 350 degrees C. The Ru concentration x can be varied by changing the power to the Mn₂Ga target while keeping that of the Ru target constant. After deposition of the active MRG layer, the samples were covered, at room temperature, with approximately 2 nm of AlO$_x$ to prevent oxidation. The Hall bar was patterned using standard UV lithography and Argon ion milling, and electrical contacts were formed by titanium/gold patterned by lift-off, as is known in the art.

The longitudinal and transverse voltages were measured using lock-in detection at the first, second and third harmonic, at a low drive frequency of approximately 1 kHz. The excitation frequency is far from the frequency of magnetisation oscillations or thermal dynamics, but provides a convenient means to separate effects that are odd or even functions of the bias current. Measurements were performed as a function of temperature and applied external magnetic field $\mu_0 H$. AHE measurements are performed after saturation in an out-of-plane magnetic field by recording the first, second and third harmonics of the drive frequency as a function of the magnitude and azimuthal angle $\phi_H$ of an applied in-plane magnetic field $\mu_0 H$.

Figure 7:
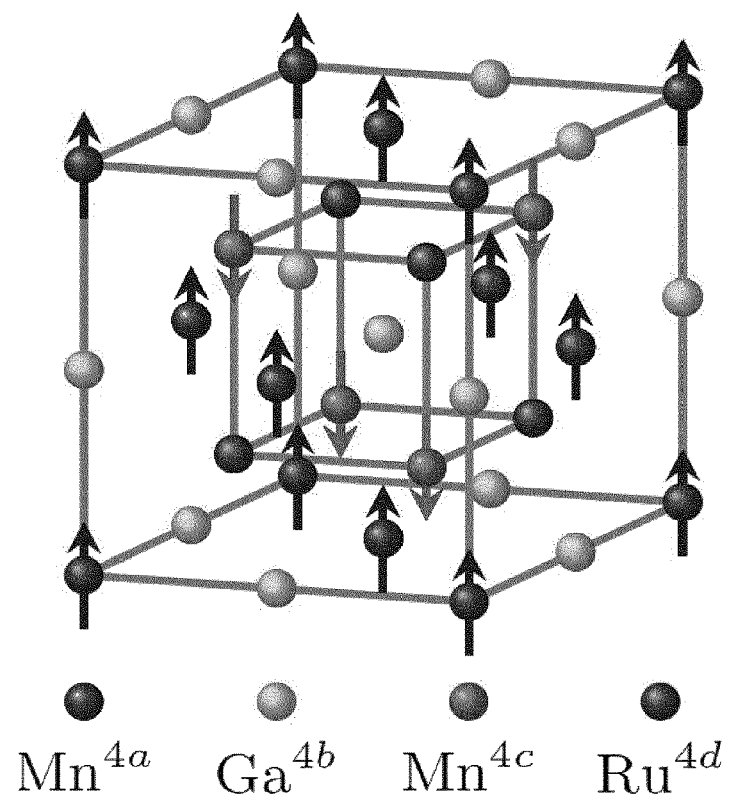
FIG. 7 illustrates the crystal structure of MRG.

Thin-film samples of MRG grown on MgO substrates by DC-magnetron sputtering from stoichiometric targets crystallise in a Heusler-like structure (space group F$\overline{4}$3m), as illustrated in FIG. 7, where the conduction bands originate predominantly from Mn in the 4c position. The arrows in FIG. 7 indicate the direction of the local magnetic moment on each site. As such, in this case the Mn atoms in the 4a position form sub-lattice A and the Mn atoms in the 4c position form the dominant current carrying sub-lattice B.

Figure 8:
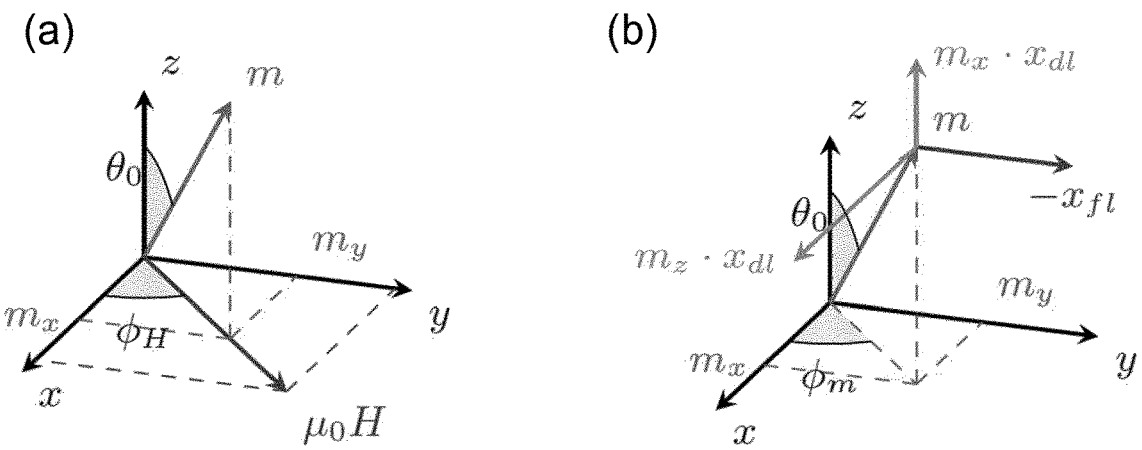
FIG. 8a illustrates the direction of the optional external magnetic field with respect to the coordinate system for the structure of 6.
FIG. 8b illustrates the direction of the two main components of the spin-orbit torque components acting on the sub-lattice magnetisation.

The coordinate system describing the magnetic state is shown in FIG. 8a. For an in-plane applied field $\mu_0 H$, the magnetisation vector m in the absence of SOT field is described by the polar and azimuthal angles $\theta_0$ and $\varphi_m$, with the latter taken to be equal to the azimuthal angle $\varphi_H$ of the applied field because the in-plane anisotropy of the MRG film is weak compared with the uniaxial perpendicular anisotropy.

Figure 9:
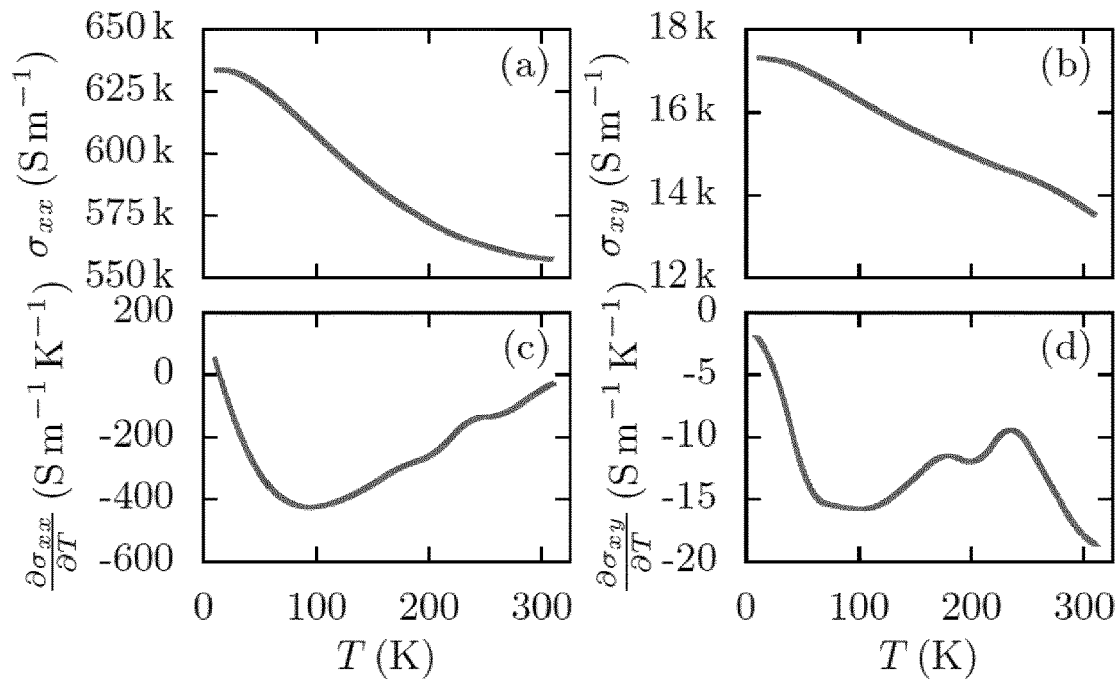
FIGS. 9a-9d shows experimental data for the temperature dependence of the longitudinal and transverse conductivities of the MRG structure of FIG. 6.

FIG. 9 shows the temperature dependence of the longitudinal and transverse conductivity $\sigma_{xx}$, $\sigma_{xy}$ of MRG, recorded in the remnant state after saturation in a positive out-of-plane field at room temperature (approximately 290 K). The longitudinal conductivity $\sigma_{xx}$ (FIG. 9a) increases with decreasing T, and its saturation value of 630 kSm$^{-1}$ or [159 μΩ cm]$^{-1}$ corresponds to the minimum metallic conductivity of a bad metal where the mean free path is comparable to the interatomic spacing. The transverse (Hall) conductivity $\sigma_{xy}$ (FIG. 9b) closely follows the Mn$^{4c}$ sub-lattice magnetisation, and shows little or no dependence on $\sigma_{xx}$. The lower panels (FIGS. 9c and 9d) show the temperature-derivatives of $\sigma_{xx}$ and $\sigma_{xy}$.

The current induced effective fields were determined from the AHE measurements, assuming that the AHE is proportional to the z component of the magnetization of the Mn$^{4c}$ (dominant) sub-lattice. The low conductivity of the MRG coupled with high values of its temperature derivative (see FIGS. 9c and 9d) leads to heating and therefore strong thermomagnetic effects (such as the normal and anomalous Nernst effect). Contributions to the transverse voltage from the anomalous Nernst effect can be suppressed by measuring the third harmonic (where it is not present) or by taking the difference between the second harmonic measured with a positive and a negative DC offset bias/current, due to its symmetry. Homogeneous current (Joule) heating ΔT is present in both cases, however, and its contribution can be determined from the data in FIG. 9

In the following, we restrict our analysis to the effect to SOT fields on one sublattice, as the other will follow via inter-sublattice exchange with a phase lag. All SOT torques are treated as equivalent to effective external applied fields, i.e. $\mu_0 H_{eff}$. In the presence of a unit charge current density j parallel to the MRG [010] axis as shown in FIG. 6, the current induced spin polarisation produces a SOT effective field according to:

$$\mu_0 h_{SOT} = m_z x_{dl} e_x - x_{fl} e_y + m_x x_{dl} e_z \tag{1}$$

where $e_x$, $e_y$, $e_z$ are unit vectors, $m_x$ and $m_z$ are the components of the unit net magnetisation vector, and $x_{fl}$ and $x_{dl}$ are the coefficients of the field-like and damping-like contributions to the SOT effective field, respectively. The units of $\mu_0 h_{SOT}$, $x_{fl}$ and $x_{dl}$ are Tm$^2$/A (also known as the Henry). FIG. 8b illustrates the effective SOT fields acting on the magnetisation when a bias current is applied along the MRG [010] parallel to y (as shown in FIG. 6), where the field-like (reactive) component is indicated by the blue arrow and the two damping-like (dissipative) components are indicated by the green arrows. The conversion from Hall voltages $V_{xy}$ detected at different harmonics to the magnitude of the effective fields is described below.

In the AHE measurement, the transverse (Hall) voltage $V_{xy}$ varies with the out-of-plane component of the net magnetization vector $m_z$, i.e. with $\cos(\theta_0 + \Delta\theta)$, where $\Delta\theta$ is a small change in the angle due to the SOT field. To convert determine the effective SOT fields from the AHE measurements it is therefore necessary to relate the small efficient SOT field $h_{SOT}$ to $\Delta\theta$.

The magnetic part of the free energy in a tetragonal system is written, to second order in anisotropy as:

$$E = K_1 \sin^2(\theta) + K_2 \sin^4(\theta) + K'_2 \sin^4(\theta)\cos(4\phi_M) - \mu_0 \vec{H}(\theta_H, \phi_H)\vec{M}(\theta, \phi_M) \tag{2}$$

where $\theta$ and $\phi_M$ are the polar and azimuthal angles of the net magnetization vector, and $\phi_H$ is the azimuthal angle of the applied field $\mu_0 H$, and $K_1$, $K_2$ and $K'_2$ are coefficients. $K'_2$ is usually much weaker than $K_{1,2}$ and we assume the in-plane component of the magnetization is aligned with the applied field $\mu_0 H$, such that $\phi_M = \phi_H$. The equilibrium position of the magnetization can then be derived from the stability condition:

$$F = \frac{\partial E}{\partial \theta} = 0. \tag{3}$$

Although equation 3 cannot be directly solved for $\theta$, the aim is to relate the small efficient SOT field $h_{SOT}$ to $\Delta\theta$. We write $H = H_0 + h_{SOT}$ and $\theta = \theta_0 + \Delta\theta$, and note that $F(\theta_0, H_0) = 0$ (the equilibrium position) as well as $$\frac{\partial^2 F}{\partial H_i \partial H_j} = 0$$

because E is linear in H. We now expand F to second order in $h_{SOT}$ which leads to a quadratic equation. Realising that $$\frac{\partial F}{\partial \theta} \gg h_{SOT},$$

me square root portion of the solution of the quadratic can be expanded to select the solution that ensures F=0 when $h_{SOT}=0$. The change in angle $\Delta\theta$ is then:

$$-\Delta\theta = \left(\frac{\partial E}{\partial \theta}\right)^{-1}(v_1 \cdot h_{SOT}) + \frac{\left(\frac{\partial F}{\partial \theta}\right)^{-2}}{2}(v_1 \cdot h_{SOT}(v_2 \cdot h_{SOT}), \tag{4}$$

where $$v_1 = \frac{\partial F}{\partial H} = \begin{pmatrix} \frac{\partial F}{\partial H_x} \\ \frac{\partial F}{\partial H_y} \\ \frac{\partial F}{\partial H_z} \end{pmatrix}, \tag{5}$$

and $$v_2 = \begin{pmatrix} 2\frac{\partial^2 F}{\partial\theta\partial H_x} - \frac{\partial^2 F}{\partial\theta\partial\theta}\frac{\partial F}{\partial H_x}\frac{1}{\frac{\partial F}{\partial\theta}} \\ 2\frac{\partial^2 F}{\partial\theta\partial H_y} - \frac{\partial^2 F}{\partial\theta\partial\theta}\frac{\partial F}{\partial H_y}\frac{1}{\frac{\partial F}{\partial\theta}} \\ 2\frac{\partial^2 F}{\partial\theta\partial H_z} - \frac{\partial^2 F}{\partial\theta\partial\theta}\frac{\partial F}{\partial H_z}\frac{1}{\frac{\partial F}{\partial\theta}} \end{pmatrix}, \tag{6}$$

which can be rewritten as $$\Delta\theta = \Delta\theta_1 j + \Delta\theta_2 j^2 \tag{7}$$

where j is the current density and the units of $\Delta\theta_1$ and $\Delta\theta_2$ are rad m$^2$/A and rad m$^4$/A$^2$, respectively, because $h_{SOT}$ is linear in j.

To derive the expressions for the second and third harmonics of the transverse voltage $V_{xy}$ taking into account the effects of homogeneous heating and the SOT field through $\Delta T$ and $\Delta\theta$, we write $\rho=\sigma^{-1}$, $\sigma_{xx}^0=\sigma_{xx}^0(1+\delta)$, $\sigma_{xy}=\sigma_{xy}^0(1+\beta)$ with $$\gamma = \frac{\partial \sigma_{xx}}{\partial T} \frac{\Delta T}{\sigma_{xx}^0} \text{ and } \varepsilon = \frac{\partial \sigma_{xy}}{\partial T} \frac{\Delta T}{\sigma_{xy}^0}.$$

$\delta$ and $\beta$ are correction factors homogenous heating and can be determined from the experimental $\sigma_{xx}(T)$ and $\sigma_{xy}(T)$ data (see FIG. 9) and $\Delta T=\chi I^2$, where $\chi$ characterises the conversion from current I to heat and is related to the resistance of the MRG sample. For MRG, the ratio $\sigma_{xy}/\sigma_{xx}$ is approximately 10% so that $\rho_{xx}\approx\sigma_{xx}^{-1}$ and $\rho_{xy}\approx\sigma_{xy}/\sigma_{xx}^2$ to within error of approximately 1%. The transverse resistivity is then given by:

$$\rho_{xy} = \frac{\sigma_{xy}^0(1+\beta)}{(\sigma_{xx}^0(1+\varepsilon))^2}\cos(\theta_0 + \Delta\theta) \quad (8)$$

Obtaining the voltage response on the second $V_{xy}^{2\omega}$ and third $V_{xy}^{3\omega}$ harmonic signals of the bias current I can be achieved by expanding equation 8 to first order in $\varepsilon$ and $\beta$, and second order in $\Delta\theta$, and expanding the powers of the sinusoidal bias current $I=I_{ac}\sin\omega t+I_{dc}$ and projecting onto the respective harmonics, which gives:

$$\frac{(V_{xy}^{2\omega}(I_{ac}, I_{dc}) - V_{xy}^{2\omega}(I_{ac}, -I_{dc}))}{I_{ac}^2 I_{dc}} = \quad (9)$$
$$\frac{6B_z\varepsilon\chi}{t(\sigma_{xx}^0)^3}\sigma_{oh} + \frac{3l\varepsilon\chi}{tw(\sigma_{xx}^0)^2} + \frac{3\Delta\theta_1^2\sigma_{xy}^0\cos(\theta_0)}{2t^3w^2(\sigma_{xx}^0)^2} -$$
$$\frac{\beta\chi\cos(\theta_0)}{t(\sigma_{xx}^0)^2} + \frac{6\varepsilon\chi\sigma_{xy}^0\cos(\theta_0)}{t(\sigma_{xx}^0)^3} + \frac{3\Delta\theta_2\sigma_{xy}^0\sin(\theta_0)}{t^3w^2(\sigma_{xx}^0)^2},$$

and $$\frac{(V_{xy}^{3\omega}(I_{ac}, 0))}{I_{ac}^3} = \frac{B_z\varepsilon\chi}{2t(\sigma_{xx}^0)^3}\sigma_{oh} + \frac{l\varepsilon\chi}{4tw(\sigma_{xx}^0)^2} + \frac{\Delta\theta_1^2\sigma_{xy}^0\cos(\theta_0)}{8t^3w^2(\sigma_{xx}^0)^2} - \quad (10)$$
$$\frac{\beta\chi\cos(\theta_0)}{4t(\sigma_{xx}^0)^2} + \frac{\varepsilon\chi\sigma_{xy}^0\cos(\theta_0)}{2t(\sigma_{xx}^0)^3} + \frac{\Delta\theta_2\sigma_{xy}^0\sin(\theta_0)}{4t^3w^2(\sigma_{xx}^0)^2},$$

where l takes into account a small longitudinal offset of one of the transverse Hall contacts due to misalignment during fabrication, w and t are the width and thickness of the MRG film, and $\sigma_{oh}$ is the normal Hall conductivity. Similar equations can be derived for the harmonics of the longitudinal voltage responses ($V_{xx}^{n\omega}$, where n is the order of the harmonic).

The extracted parameters for the field and damping-like contributions to the SOT are obtained by fitting equations 9 and 10 to the experimental data using values for $\sigma_{xx}^0$, $\varepsilon$ and $\beta$ and anisotropy constants determined experimentally.

Figure 10:
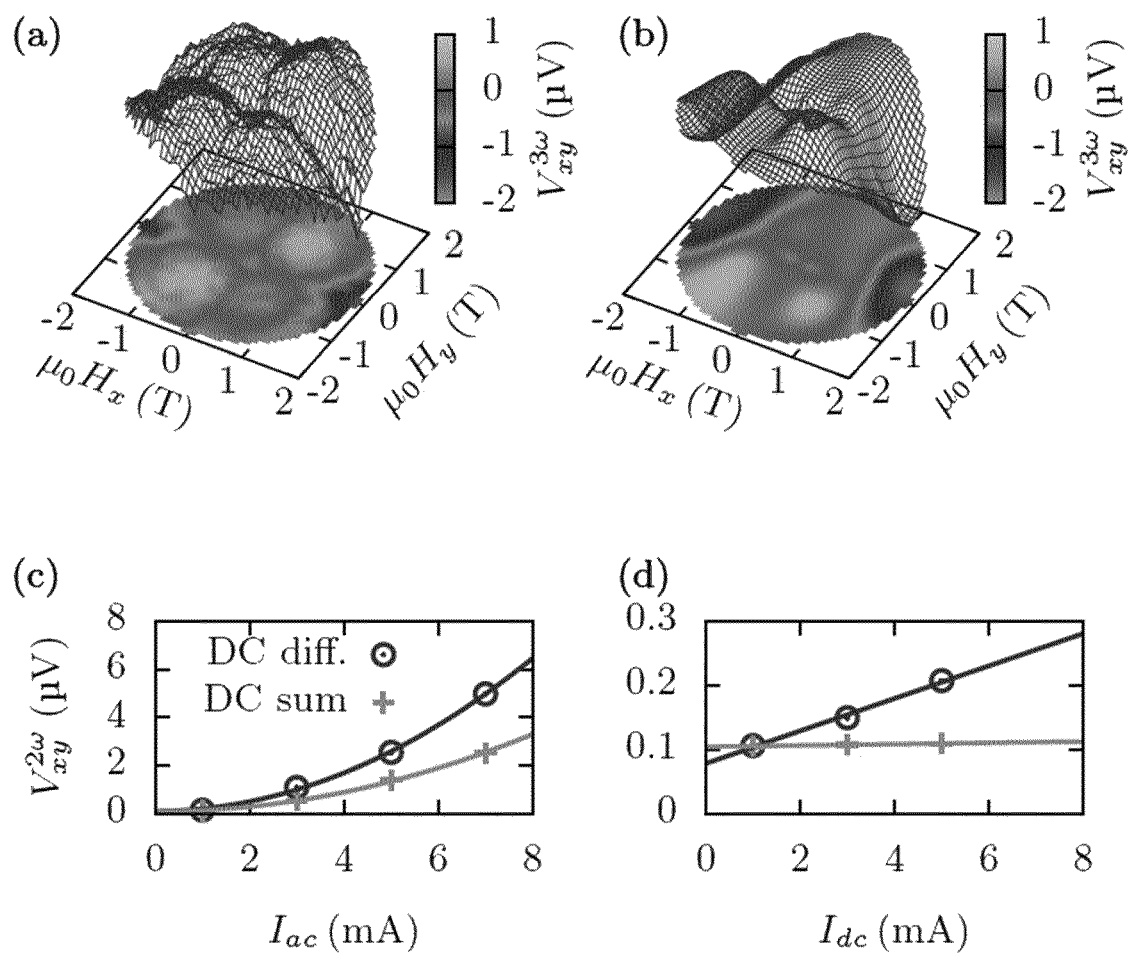
FIGS. 10a and 10b show a surface plot and its 2D image plot of the experimentally determined and modelled dependence of the third harmonic of the transverse voltage on the in-plane magnetic field; respectively.
FIGS. 10c and 10d show the dependence of the second harmonic of the transverse voltages on ac current and dc current respectively.

FIG. 10a shows a surface plot and its 2D image plot projection of the experimentally observed dependence of transverse voltage at the third harmonic $V_{xy}^{3\omega}$ on the x and y components of the applied field $\mu_0 H$, obtained by varying the azimuthal angle $\phi_H$ at a fixed temperature of 310 K. FIG. 10b shows the corresponding calculated values using equation 10 with experimentally determined values of $\theta_0$, $\sigma_{xx}^0$, $\varepsilon$ and $\beta$ from the date in FIG. 9. There is good qualitative and quantitative agreement between the experimental and modelled data when fitting the coefficients of the field-like and damping-like SOT fields with the values $x_{fl}=-15\times10^{-13}$ Tm$^2$/A and $x_{dl}=50\times10^{-13}$ Tm$^2$/A.

All the salient features in the experimental data are reproduced in the model: the two deep minima near the +/− maximum field in the x-direction $\mu_0 H_x$, four maxima that correspond to the fourfold in-plane anisotropy of MRG (due to the small value of the in-plane anisotropy constant $K'_2$), as well as a weaker central minimum around H=0. Qualitatively, the shape of the SOT can be understood by comparing equation 1 with the blue surface plots and projected 2D image plots in FIG. 10, and noting that the magnitude of $\Delta\theta$ depends not only on $\theta_0$ itself, but explicitly on the competition between the SOT field, the anisotropy field and the applied field. At low applied fields (where $\theta_0 \sim 0$) the current-driven wobble (i.e. $\Delta\theta$) of the magnetisation vector m is determined by a combination of the anisotropy and SOT fields. $\Delta\theta$ is small, however, because $\cos\theta_0 \sim 1$, hence the central minimum is shallow. At higher applied fields, $\theta_0$ deviates from 0, but the SOT field now has to compete with both the (higher) anisotropy field and the Zeeman torque provided by the applied field acting on the net magnetisation. This gives rise to the characteristic four-fold signal. An exceptional feature appears around $\mu_0 H_x \sim 2$ T and $j \sim 1 \times 10^6$ A cm$^{-2}$ where the damping-like field in the z direction scaling as $m_x$ produces a SOT field strong enough to dwarf the anisotropy field and the applied field.

It is expected from the model of equation 9 that the contribution to $V_{xy}^{2\omega}$ from SOT scales with $I_{dc}$ and $I_{ac}^2$, while the anomalous Nernst effect should be independent of $I_{dc}$ and scale as $I_{ac}^2$. FIGS. 10c and 10d show the dependence of the transverse voltage at the second harmonic $V_{xy}^{2\omega}$ on the applied AC (with $I_{dc}=3$ mA) and DC (with $J_{ac}=1$ mA) current, respectively. The circle and cross symbols represent the difference and sum of the voltages $V_{xy}^{2\omega}$ obtained with a positive and negative DC offset ($I_{ac}$), respectively. The anomalous Nernst effect is expected to be absent in the difference signal. A current of 1 mA in the device of FIG. 6 corresponds to a current density of about $2.5\times10^5$ A cm$^{-2}$. As shown in FIGS. 10c and 10d, the DC difference (circle symbols) is quadratic in $I_{ac}$ (FIG. 10c) and linear in $I_{dc}$ (FIG. 10d), while the DC sum (cross symbols) is quadratic in $I_{ac}$ and independent of $I_{dc}$. This demonstrates that the contribution from the SOT is indeed isolated from the Nernst effect in the DC difference signal.

It is instructive to compare the effective fields due to SOT with those recorded on conventional bilayers of a heavy metal (typically Pt, Ta or W) and a 3d ferromagnet (typically Co, Fe, CoFe or CoFeB). For bi-layers, the damping-like effective field per current density can be written: $\mu_0 H_{dl}/j = (\theta_{SH}\hbar)/(2eM_s t)$, where $\theta_{SH}$ is the spin-Hall angle of the heavy metal, $\hbar$ is the Planck's constant, e is the electron charge, $M_s$ the magnetisation of the ferromagnet and t its thickness. For 1 nm of CoFeB ($M_s \sim 1$ MA m$^{-1}$), which has a magnetic moment equivalent to that of a nearly compensated ~30 nm thick MRG film, and $\theta_{SH}=40\%$ we obtain an effective damping-like field of $1.3\times10^{-13}$ T m$^2$/A or 0.13 pH. A fictitiously large spin-Hall angle of 400% would be needed to match the value of the determined field-like term of $15\times10^{-13}$ Tm$^2$/A in MRG and 1200% to match the determined damping-like term of $50\times10^{-13}$ Tm$^2$/A in MRG. As such, compared to the effective SOT fields in heavy metal/ferromagnet bilayers, the values determined for a 30 nm thick MRG film are up to two orders of magnitude greater and independent of the thickness of the MRG film (for fixed current density).

This comparison highlights the inherent advantage of using a single ferrimagnetic layer in combination with intrinsic SOT. In a ferromagnetic bilayer, increasing the thickness of the ferromagnet beyond the spin diffusion length (typically <10 nm), does not produce any additional SOT. If the ferromagnet is 2 nm rather than 1 nm thick, the effective SOT field may be reduced to half, whereas the SOT field in single layer of MRG is unchanged with thickness. For a fixed current density, the volume of MRG can be scaled up or down without changing the SOT torque.

However, the nature of the intrinsic SOT torque in MRG is staggered, acting directly on the $Mn^{4c}$ sub-lattice, hence a more correct comparison might be to normalise the spin Hall angle using the sub-lattice magnetisation, which is approximately ten times greater than the net magnetisation at room temperature for the 30 nm thick MRG film. Furthermore, the SOT torque is maintained even in the absence of net magnetisation at the ferrimagnetic compensation temperature, thus permitting GMR and TMR based device structures to be excited by SOT even in the absence of any net magnetic moment. This enables a far more targeted control of the dynamics, and the excitation of both in-and out-of phase resonance modes.

Figure 11:
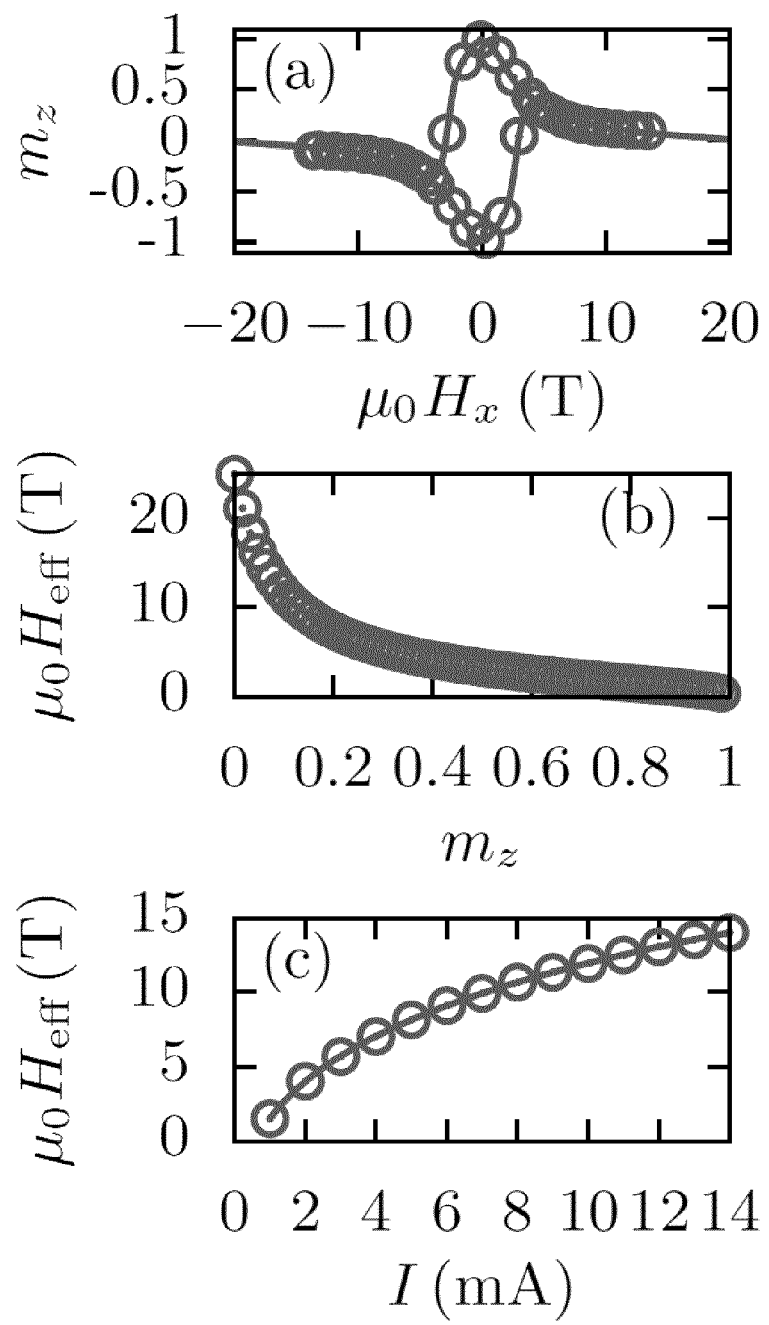
FIG. 11a shows a hysteresis loop of the out-of-plane component of the magnetisation vector with applied in-plane magnetic field for the structure of FIG. 6.
FIG. 11b shows the dependence of the effective magnetic field on the out-of-plane component of the magnetisation vector.
FIG. 11c shows the dependence of the azimuthal-angle-independent effective magnetic field on the applied current in the device of FIG. 6.

The high effective fields found in the linear response, FIGS. 10a-10c, imply that the action of the SOT should also be observable in the non-linear transfer characteristics of MRG device 500. FIG. 11a shows an experimental field-in-plane hysteresis loop from −14 T to 14 T obtained at 310 K showing the relationship between the observed $m_z$ and the applied in-plane field. The line shows a fit to the data (symbols). FIG. 11b shows the effective (in-plane) field $\mu_0 H_{eff}$ as a function of the measured value of $m_z$, inferred from numerical inversion of the data in FIG. 11a. The data in FIG. 11b allows one to deduce, from $m_z$, the value of $\mu_0 H_{eff}$ at a given applied current, which is shown in FIG. 11c for a fixed applied in plane field of 0.4 T.

Figure 12:
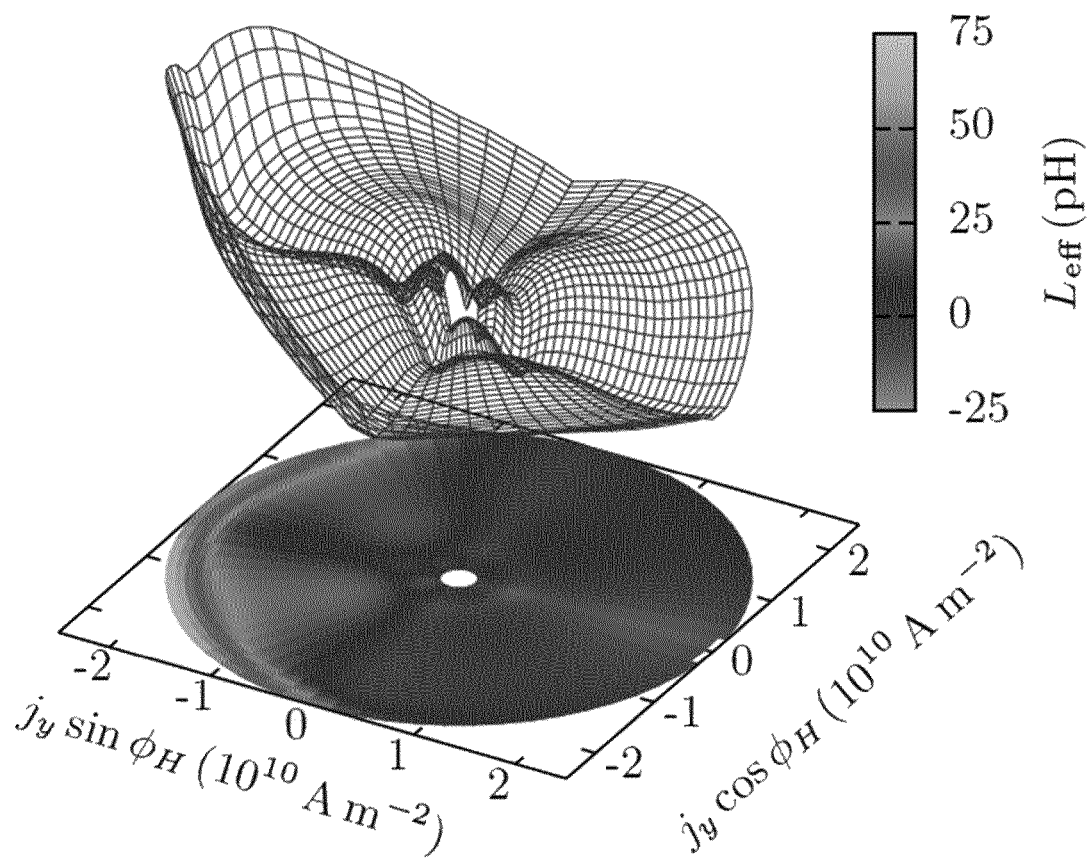
FIG. 12 shows a surface plot and its 2D image plot of the dependence of the non-linear with respect to current effective field, expressed as an effective non-linear inductance, on the applied current and the azimuthal angle of in-plane magnetic field.

$m_z$ is then measured (from $V_{xy}$) with a constant in-plane field $\mu_0 H$=0.4 T as function of the azimuthal angle $\phi_H$ for range of current densities from 0.2 to $2.5 \times 10^6$ A m$^{-2}$. As the action of the SOT field depends directly on its direction relative to the direction of the magnetization vector m ($\theta_M$ and $\phi_M \approx \phi_H$), any variations that are $\phi$-independent, shown in FIG. 11c, can be subtracted. This $\phi$-independent effective field contains all variations that are due to heating. The result, after subtraction, is shown in FIG. 12, where the effective field has been presented in terms of the effective, current-induced inductance in pH ($1 \times 10^{-12}$ T m$^2$/A). As shown, a current density of $j=2.5 \times 10^6$ A cm$^{-2}$ can produce an effective inductance $L_{eff} \approx 75$ pH, equivalent to an effective in-plane field of approximately 1.9 T. We note that this field is sufficient to magnetically switch≈2% of the sample.

The strong observed effective SOT fields in MRG are related to its high anomalous Hall angle (see N. Thiyagarajah et al. Applied Physics Letters, 106, 122402 (2015)). The anomalous Hall angle value is unusual in the sense that MRG does not contain any elements heavier than Ru, and in any case the AHE angle does not scale with Ru content x. Furthermore the conduction electrons in MRG are predominantly d-like, while it has been suggested that Ga in the Mn-containing Heuslers lends some p character to the bands at the Fermi-level through hybridisation, increasing the spin-orbit coupling of the conduction electrons (see Y. C. Lau et al. Physical Review B, 99, 064410 (2019)). From our measurements of $\sigma_{xx}$ and $\sigma_{xy}$ (in FIG. 9) we can deduce the spin-orbit scattering cross-section and find that it corresponds to 60% of the unit cell surface area. The very large scattering cross section is consistent with the very short mean free path in MRG.

The above results demonstrate that, in the example material MRG, high current-induced effective fields as well as a high ratio (∼3) of the dissipative (anti-damping) to the reactive (field-like) SOT torques exists. To demonstrate that sustained oscillations of the magnetisation can be driven by the SOT we consider first the results established by Troncoso et al. (Physical Review B, 99, 054433 (2019)), noting that the effective fields will act distinctly on the magnetisation and the Neel vectors. Using the numerical values of the effective fields found in the linear, low-current regime, oscillations will emerge for current densities that provide a reactive torque which is sufficient to overcome the in-plane anisotropy ∼0.1 T for MRG, which corresponds to $j > 7 \times 10^6$ A cm$^{-2}$. The second necessary condition is that the dissipative torque must overcome the Gilbert damping α. Taking $\alpha \approx 0.01$ we find the condition $j > 10 \times 10^6$ A cm$^{-2}$. Second, we directly compare the effective inductance created by the SOT and the self-inductance of the oscillating element. In a device structure of the shorted Hall bar type, a crude estimate of the self-inductance for a 500 nm thick MRG film with an active length of 20 μm is about 0.1 pH (where the device dimensions are chosen to enhance impedance matching to free space in a real oscillator). FIG. 11d shows that the effective inductance reaches values of 75 pH that are two orders of magnitude greater than this, even in the low current density region. The natural of the oscillator will be determined by the larger of the two effective inductances, that is by the SOT and the magnetic resonance frequency of the material, which has previously been estimated as 0.75 THz (see C. Fowley et al. Physical Review B, 98, 220406 (2018)).

As such, with realistic values of the Gilbert damping, oscillations in the magnetisation can be achieved in ferrimagnets such as MRG at attainable current densities that are similar to those used existing STT devices. Such magnetic oscillations are converted to oscillations in the current and/or voltage via magnetoresistive effects, such as AMR, GMR and TMR. Alternatively or additionally, such oscillations can be directly emitted into free space using a suitable antenna.

Although the above experimental results are shown for a 30 nm thick MRG with x=0.7, it will be appreciated that the results and findings are not limited to the particular sample studied, but will apply to MRG with different dimensions and Ru contents, and different ferrimagnets such as MnFeGa, or MnGa, as well as other ferrimagnetic materials not studied or reported to date.

From reading the present disclosure, other variations and modifications will be apparent to the skilled person. Such variations and modifications may involve equivalent and other features, which are already known in the art, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, and any reference signs in the claims shall not be construed as limiting the scope of the claims.

The invention claimed is:

1. A method of generating voltage and/or current oscillations in a single magnetic layer, the magnetic layer having a thickness in a thickness direction, comprising: applying a direct voltage and/or current to the layer in a longitudinal direction perpendicular to the thickness direction; and developing a longitudinal voltage between a pair of longitudinal voltage leads and/or a transverse voltage between a pair of transverse voltage leads; wherein the layer comprises a ferrimagnetic or anti-ferrimagnetic material having a first and second magnetic sub-lattice, wherein the first sub-lattice is a dominant sub-lattice such that the charge carriers at the Fermi energy originate predominantly from the dominant sub-lattice and the charge carriers at the Fermi energy are spin polarised; and wherein: i) the first and second magnetic sub-lattices have an ordered non-collinear magnetic structure such that the angle between the local magnetic moment of the first and second magnetic sub-lattices is uniform in the layer and an azimuthal angle of the local magnetic moment of the first magnetic sub-lattice about the direction of the local magnetic moment of the second magnetic sub-lattice varies periodically along one or more spatial directions giving a magnetic texture, and the wavelength of the magnetic structure is longer than the Fermi wavelength; or ii) the first and second magnetic sub-lattices have a disordered non-collinear magnetic structure such that the angle between the local magnetic moment of the first and second magnetic sub-lattices is uniform in the layer and the azimuthal angle is non-uniform and/or random in the layer and the dominant current carrying sub-lattice lacks inversion symmetry; or iii) the first and second magnetic sub-lattices have a collinear magnetic structure at a current density below a first threshold current density and the dominant current carrying sub-lattice lacks inversion symmetry.

2. The method of claim 1, wherein, where: the first and second magnetic sub-lattice have a disordered non-collinear magnetic structure such that the angle between the local magnetic moment of the first and second magnetic sub-lattices is uniform in the layer and the azimuthal angle is non-uniform and/or random in the layer and the dominant current carrying sub-lattice lacks inversion symmetry, or the first and second magnetic sub-lattices have a collinear magnetic structure at a current density below a first threshold current density and the dominant current carrying sub-lattice lacks inversion symmetry: and the current-induced spin-orbit-interaction energy is at least 50% of the energy of the first non-collinear excited state.

3. The method of claim 2, wherein the magnetic layer comprises a material comprising a first atomic species, and a second p-block atomic species.

4. The method of claim 3, wherein one sub-lattice comprises atoms with high-Z: at least Ga.

5. The method of claim 1, wherein, where: the first and second magnetic sub-lattices have a disordered non-collinear magnetic structure such that the angle between the local magnetic moment of the first and second magnetic sub-lattices is uniform in the layer and the azimuthal angle is non-uniform and/or random in the layer and the dominant current carrying sub-lattice lacks inversion symmetry, or the first and second magnetic sub-lattices have a collinear magnetic structure at a current density below a first threshold current density and the dominant current carrying sub-lattice lacks inversion symmetry, the dominant sub-lattice exhibits a spin-orbit splitting energy of at least 100 meV.

6. The method of claim 1, wherein the material has a damping factor of less than or approximately equal to 0.01.

7. The method of claim 1, wherein where the first and second magnetic sub-lattices have a disordered non-collinear magnetic structure such that the angle between the local magnetic moment of the first and second magnetic sub-lattices is uniform in the layer and the azimuthal angle is non-uniform and/or random in the layer and the dominant current carrying sub-lattice lacks inversion symmetry, the probability of inter-sub-lattice scattering involving spin flip is greater than inter-sub-lattice scattering not involving spin flip.

8. The method of 1, wherein the inter-sub-lattice (neighbouring spin belonging to different sub-lattices) exchange parameter is weaker than at least one intra-sub-lattice (neighbouring spin belonging to the same sub-lattice) exchange parameter.

9. The method of claim 1, further comprising making an electrical short circuit between the pair of transverse voltage leads.

10. The method of claim 1, wherein the magnetic layer comprises a ferrimagnet.

11. The method of claim 1, wherein the magnetic layer comprises a half-metallic ferrimagnet.

12. The method of claim 1, wherein the magnetic layer exhibits a spin polarisation of at least 50%.

13. The method of claim 12, wherein the magnetic layer exhibits a spin polarisation of at least 50% at 300 Kelvin.

14. A system comprising a device for generating voltage and/or current oscillations, the device comprising: a single magnetic layer through which a current or voltage is applied in a longitudinal direction perpendicular to a thickness direction; and a pair of longitudinal and/or transverse voltage leads for measuring a respective longitudinal and/or transverse voltage; wherein the layer comprises a ferrimagnetic or anti-ferrimagnetic material having a first and second magnetic sub-lattice, wherein the first sub-lattice is a dominant sub-lattice such that the charge carriers at the Fermi energy originate predominantly from the dominant sub-lattice and the charge carriers at the Fermi energy are spin polarised; and wherein: i) the first and second magnetic sub-lattices have an ordered non-collinear magnetic structure such that the angle between the local magnetic moment of the first and second magnetic sub-lattices is uniform in the layer and an azimuthal angle of the local magnetic moment of the first magnetic sub-lattice about the direction of the local magnetic moment of the second sub-lattice varies periodically along one or more spatial directions giving a magnetic texture, and the wavelength of the magnetic structure is longer than the Fermi wavelength; or ii) the first and second magnetic sub-lattices have a disordered non-collinear magnetic structure such that the angle between the local magnetic moment of the first and second magnetic sub-lattices is uniform in the layer and the azimuthal angle is non-uniform and/or random in the layer and the dominant current carrying sub-lattice lacks inversion symmetry; or iii) the first and second magnetic sub-lattices have a collinear magnetic structure at a current density below a first threshold current density and the dominant current carrying sublattice lacks inversion symmetry.

15. The system of claim 14, further comprising a means for applying the voltage and/or current to the device.

16. The system of claim 14, further comprising a means for measuring the longitudinal and/or transverse voltage.

17. The system of claim 14, further comprising a means for extracting the generated voltage and/or current oscillations from the longitudinal and/or transverse voltage.

18. The system of claim 17, wherein the means for extracting the generated voltage and/or current oscillations comprises a bias tee and/or a capacitor coupled to the longitudinal and/or transverse voltage leads.

19. The system of claim 14, wherein the magnetic layer comprises a ferrimagnet, and/or a half-metallic ferrimagnet.

20. The system of claim 14, wherein the magnetic layer comprises MnRuGa, MnFeGa, or MnGa.

* * * * *